United States Patent
Jung et al.

(10) Patent No.: US 10,943,893 B2
(45) Date of Patent: *Mar. 9, 2021

(54) STRETCHABLE DISPLAY DEVICE

(71) Applicant: LG Display Co., Ltd., Seoul (KR)

(72) Inventors: Hyunju Jung, Seoul (KR); Eunah Kim, Seosan-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/532,942

(22) Filed: Aug. 6, 2019

(65) Prior Publication Data

US 2020/0051964 A1 Feb. 13, 2020

(30) Foreign Application Priority Data

Aug. 8, 2018 (KR) .................. 10-2018-0092642
Jul. 4, 2019 (KR) .................. 10-2019-0080865

(51) Int. Cl.
*H01L 25/16* (2006.01)
*H01L 27/32* (2006.01)
*H01L 51/00* (2006.01)
*H01L 51/56* (2006.01)

(52) U.S. Cl.
CPC .......... *H01L 25/167* (2013.01); *H01L 25/162* (2013.01); *H01L 27/3276* (2013.01); *H01L 27/3293* (2013.01); *H01L 51/0097* (2013.01); *H01L 51/56* (2013.01); *H01L 2227/323* (2013.01)

(58) Field of Classification Search
CPC ............ H01L 27/3276; H01L 27/1218; H01L 2251/5338; H01L 51/0097; H01L 25/0753; H01L 25/167
See application file for complete search history.

(56) References Cited

U.S. PATENT DOCUMENTS

| | | | |
|---|---|---|---|
| 9,040,337 B2 | 5/2015 | Park et al. | |
| 9,536,860 B2 | 1/2017 | Yoon et al. | |
| 9,844,133 B2* | 12/2017 | Tomita ................. | H05K 1/18 |
| 2002/0094701 A1 | 7/2002 | Biegelsen et al. | |

(Continued)

FOREIGN PATENT DOCUMENTS

| | | |
|---|---|---|
| CN | 108183126 A | 6/2018 |
| EP | 3104370 A1 | 12/2016 |

(Continued)

*Primary Examiner* — Zandra V Smith
*Assistant Examiner* — John M Parker
(74) *Attorney, Agent, or Firm* — Seed IP Law Group LLP

(57) ABSTRACT

The present disclosure provides a stretchable display device, comprising: a lower substrate made of a stretchable insulating material and having an active area and a non-active area adjacent to the active area; a plurality of individual substrates spaced apart from each other and disposed in the active area of the lower substrate; pixels disposed on the plurality of individual substrates respectively; and a plurality of connecting lines disposed between the plurality of individual substrates on the lower substrate, and electrically connecting corresponding pads disposed within the plurality of individual substrates respectively. The modulus of the plurality of individual substrates is higher than the lower substrate.

29 Claims, 18 Drawing Sheets

(56) References Cited

U.S. PATENT DOCUMENTS

| | | | |
|---|---|---|---|
| 2004/0192082 A1* | 9/2004 | Wagner | H05K 1/11 439/67 |
| 2010/0155757 A1 | 6/2010 | Kim et al. | |
| 2012/0051005 A1* | 3/2012 | Vanfleteren | H01L 23/3142 361/749 |
| 2012/0062447 A1 | 3/2012 | Tseng et al. | |
| 2012/0250323 A1* | 10/2012 | Velu | F21V 29/004 362/249.02 |
| 2013/0088662 A1 | 4/2013 | Watanabe et al. | |
| 2014/0131715 A1 | 5/2014 | Liu et al. | |
| 2014/0299362 A1* | 10/2014 | Park | H05K 1/0283 174/254 |
| 2015/0009129 A1 | 1/2015 | Song et al. | |
| 2015/0380355 A1 | 12/2015 | Rogers et al. | |
| 2016/0172428 A1 | 6/2016 | Song et al. | |
| 2016/0211483 A1 | 7/2016 | Kwon | |
| 2017/0005077 A1 | 1/2017 | Kim et al. | |
| 2017/0169918 A1 | 6/2017 | Park et al. | |
| 2017/0192319 A1 | 7/2017 | Zhang et al. | |
| 2017/0249886 A1 | 8/2017 | Choi | |
| 2018/0046221 A1 | 2/2018 | Choi et al. | |
| 2018/0090039 A1 | 3/2018 | Singireddy | |
| 2019/0019441 A1 | 1/2019 | Shin et al. | |
| 2019/0267440 A1 | 8/2019 | Park et al. | |
| 2019/0280248 A1 | 9/2019 | Kwon et al. | |
| 2020/0028102 A1 | 1/2020 | Kim et al. | |
| 2020/0119290 A1 | 4/2020 | Shin | |

FOREIGN PATENT DOCUMENTS

| | | |
|---|---|---|
| EP | 3232743 A1 | 10/2017 |
| KR | 10-2014-0039572 A | 4/2014 |
| KR | 10-2015-0069079 A | 6/2015 |
| KR | 10-2016-0020034 A | 2/2016 |
| KR | 10-1647023 B1 | 8/2016 |
| KR | 10-2017-0034522 A | 3/2017 |
| KR | 10-2017-0061313 A | 6/2017 |
| KR | 10-2017-0110209 A | 10/2017 |
| KR | 10-2017-0111634 A | 10/2017 |
| KR | 10-2017-0112151 A | 10/2017 |
| TW | 200424981 A | 11/2004 |

* cited by examiner

STRETCHABLE DISPLAY DEVICE

CROSS-REFERENCE TO RELATED APPLICATIONS

This application claims the priority of Korean Patent Application No. KR 10-2018-0092642 filed on Aug. 8, 2018 and No. KR 10-2019-0080865 filed on Jul. 4, 2019, in the Korean Intellectual Property Office, the disclosure of which are incorporated herein by reference.

BACKGROUND

Technical Field

The present disclosure relates to a stretchable display device and, more particularly, to a stretchable display device of which the aperture ratio is improved and of which the image quality is compensated even though the stretchable display device is stretched.

Description of the Related Art

An Organic Light Emitting Display (OLED) that emits light by itself, a Liquid Crystal Display (LCD) that requires separate light sources, etc., are used as the display devices used for a computer monitor, a TV, and a mobile phone.

Display devices are being applied to more and more various fields including not only a computer monitor and a TV, but also personal mobile devices, and a display device having a wide active area and reduced volume and weight is being studied.

Recently, a stretchable display device manufactured to be able to stretch/contract in a specific direction and change into various shapes by forming a display unit, lines, etc., on a flexible substrate such as plastic that is a flexible material has been spotlighted as a next generation display device.

BRIEF SUMMARY

An object of the present disclosure is to provide a stretchable display device that can suppress deterioration of image quality of a display device when the display device is stretched, by disposing additional pixels having an uneven shape on a lower substrate.

Another object of the present disclosure is to provide a stretchable display device that can improve an aperture ratio by disposing additional pixels in an area excepting areas where a plurality of individual substrates and connecting lines are disposed on a lower substrate.

Another object of the present disclosure is to provide a stretchable display device that can suppress cracking of a line by minimizing stress concentrating in the wires when a substrate is stretched, by forming an uneven shape in areas where connecting lines are formed on a lower substrate.

Objects of the present disclosure are not limited to the above-mentioned objects, and other objects, which are not mentioned above, can be clearly understood by those skilled in the art from the following descriptions.

In an aspect of the present disclosure, there is provided a stretchable display device, comprising: a lower substrate made of a stretchable insulating material and having an active area and a non-active area adjacent to the active area; a plurality of individual substrates spaced apart from each other and disposed in the active area of the lower substrate; pixels disposed on the plurality of individual substrates respectively; and a plurality of connecting lines disposed between the plurality of individual substrates on the lower substrate, and electrically connecting corresponding pads disposed within the plurality of individual substrates respectively. The modulus of the plurality of individual substrates is higher than the lower substrate.

Other detailed matters of the exemplary embodiments are included in the detailed description and the drawings.

The present disclosure has an effect that efficiently uses the area of a stretchable display device and increases an aperture ratio by disposing additional subpixels in the other area excepting a light emitting area and a line area on a lower substrate.

The present disclosure has an effect that suppresses deterioration of image quality of a stretchable display device when the stretchable display device is stretched by forming additional subpixels in a curved shape to be able to stretch.

The present disclosure has an effect that increases resolution by independently driving subpixels by connecting additional subpixels to different circuit units from existing subpixels.

The present disclosure can protect additional subpixels even though a stretchable display device is deformed such as bending or stretching by disposing an encapsulation layer having flexibility on the additional subpixels.

The present disclosure can suppress cracking of a lower substrate and lines by converting stress when a substrate is stretched into bending stress by applying an uneven structure to areas where connecting lines are disposed on the lower substrate.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
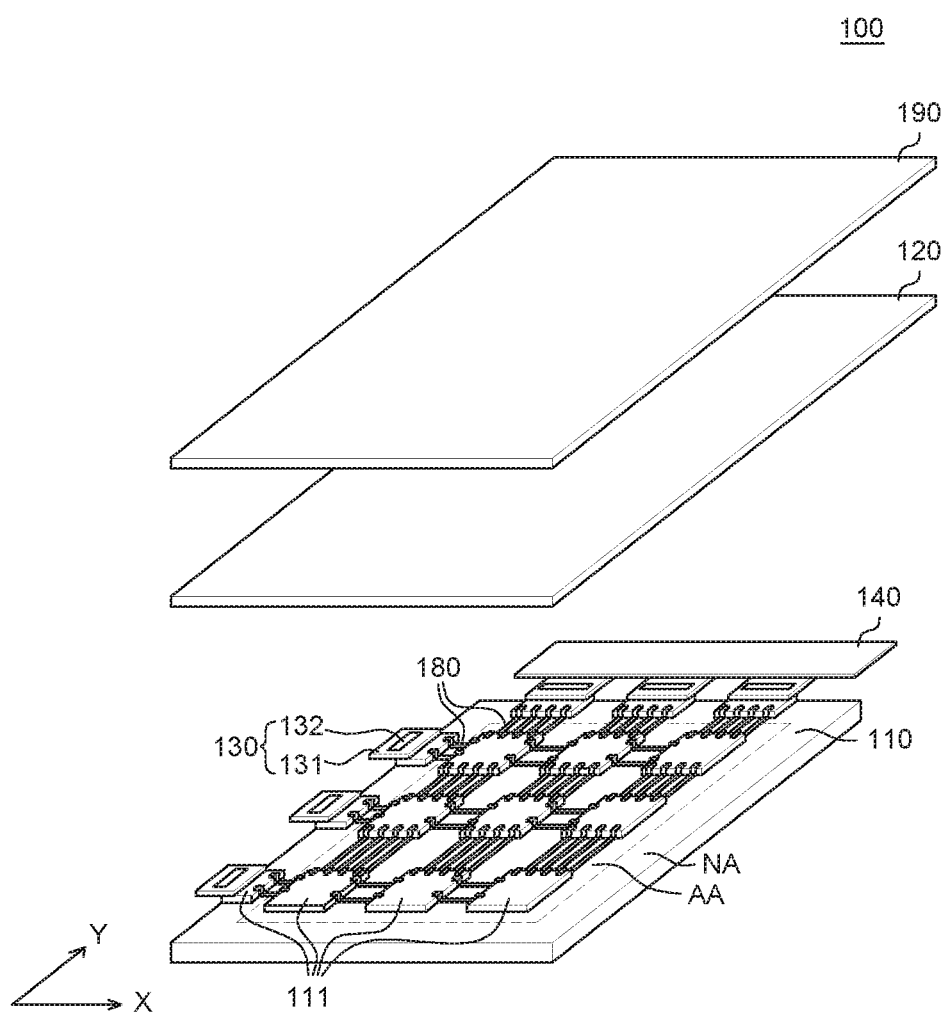
FIG. 1 is an exploded perspective view of a stretchable display device according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a stretchable display device according to exemplary embodiments of the present disclosure will be described in detail with reference to accompanying drawings.

Stretchable Display Device

A stretchable display device may be referred to as a display device that can display images even if it bends or stretches. A stretchable display device can have high flexibility, as compared with common display devices of the related art. Accordingly, the shape of the stretchable display device can be freely changed in accordance with operation by the user such as bending or stretching the stretchable display device. For example, when a user holds and pulls an end of a stretchable display device, the stretchable display device can be stretched by the force of the user. Alternatively, when a user puts a stretchable display device on an uneven wall, the stretchable display device can bend into the surface shape of the wall. Further, when the force applied by a user is removed, a stretchable display device can return into the initial shape.

FIG. 1 is a plan view showing a display device according to an embodiment of the present disclosure. Referring to FIG. 1, a stretchable display device 100 includes a lower substrate 110, a plurality of individual substrates 111, connecting lines 180, Chip on Films (COF) 130, a printed circuit board 140, an upper substrate 120, and a polarizing layer 190. An adhesive layer for bonding the lower substrate 110 and the upper substrate 120 is not shown in FIG. 1 for the convenience of description. Each individual substrate 111 of the plurality of substrates can be considered an island substrate since each one is spaced from each other individual substrate.

The lower substrate 110 is a substrate for supporting and protecting various components of the stretchable display device 100. The lower substrate 110, which is a flexible substrate, may be made of a bendable or stretchable insulating material. For example, the lower substrate 110 may be made of silicon rubber such as polydimethylsiloxane (PDMS) or an elastomer such as polyurethane (PU), so it can have flexibility. The material of the lower substrate 110, however, is not limited thereto.

The lower substrate 110, which is a flexible substrate, can reversibly expand and contract. Further, an elastic modulus may be several to hundreds of MPa and a tensile fracture rate may be 100% or more. The thickness of the lower substrate may be 10 μm to 1 mm, but is not limited thereto.

The lower substrate 110 may have an active area AA and a non-active area NA adjacent to the active area AA.

The active area AA is an area where images are displayed on the stretchable display device 100, and light emitting elements and various driving elements for driving the light emitting elements are disposed in the active area AA. The active area AA includes a plurality of pixels including a plurality of subpixels. The plurality of pixels are disposed in the active area AA and include a plurality of light emitting elements. The plurality of subpixels each may be connected with various lines. For example, the plurality of subpixels each may be connected with various lines such as a gate line, a data line, a high-potential power line, a low-potential power line, and a reference voltage line.

The non-active area NA is an area adjacent to the active area AA. The non-active area NA is an area disposed adjacent to the active area AA and adjacent to the active area AA. The non-active area NA is an area where an image is not displayed, and lines, circuit units, etc., may be disposed in the non-active area NA. For example, a plurality of pads may be disposed in the non-active area NA and each of the pads may be connected with each of the plurality of subpixels in the active area AA.

The plurality of individual substrates 111 are disposed on the lower substrate 110. The plurality of individual substrates 111, which are rigid substrates, are spaced apart from each other and disposed on the lower substrate 110. The plurality of individual substrates 111 may be more rigid than the lower substrate 110. That is, the lower substrate 110 may be softer or more flexible than the plurality of individual substrates 111 and the plurality of individual substrates 111 may be more rigid than the lower substrate 110.

The plurality of individual substrates 111 may also be made of a plastic material having flexibility and, for example, may be made of polyimide (PI), polyacrylate, polyacetate, etc.

The modulus of the plurality of individual substrates 111 may be higher than that of the lower substrate 110. The modulus is an elastic modulus showing the ratio of deformation of a substrate deformed by stress to stress applied to the substrate, and when the modulus is relatively high, the hardness may be relatively high. Accordingly, the plurality of individual substrates 111 may be a plurality of rigid substrates that is more rigid than the lower substrate 110. The modulus of the plurality of individual substrates 111 may be a thousand times or larger than that of the lower substrate 110, but are not limited thereto.

The connecting lines 180 are disposed between the plurality of individual substrates 111. The connecting lines 180 may be disposed between the pads disposed on the plurality of individual substrates 111 and may electrically connect each pad. The connecting lines 180 will be described in more detail with reference to FIG. 2.

The COFs 130, which are films having various components on flexible base films 131, are components for supplying signals to the plurality of subpixels in the active area AA. The COFs 130 may be bonded to the plurality of pads disposed in the non-active area NA and supply a power voltage, a data voltage, a gate voltage, etc., to each of the plurality of subpixels in the active area AA through the pads. The COFs 130 each include a base film 131 and a driving IC 132 and in addition to those, may include various other components.

The base films 131 are layers supporting the driving ICs 132 of the COFs 130. The base films 131 may be made of an insulating material, for example, an insulating material having flexibility.

The driving ICs 132 are components that process data for displaying images and driving signals for processing the data. Although the driving ICs 132 are mounted in the type of the COF in FIG. 1, the driving ICs 132 are not limited thereto and the driving ICs 132 may also be mounted in the type of Chip On Glass (COG), Tape Carrier Package (TCP), etc.

Controllers such as an IC chip and a circuit unit may be mounted on the printed circuit board 140. Further, a memory, a processor, etc., also may be mounted on the printed circuit board 140. The printed circuit board 140 is a configuration that transmits signals for driving the plurality of pixels from the controllers to the plurality of pixels.

The printed circuit board 140 is connected with the COFs 130, so they may be electrically connected with each of the plurality of subpixels on the plurality of individual substrates 111.

The upper substrate 120 is a substrate overlapped with the lower substrate 110 to protect various components of the stretchable display device 100. The upper substrate 120, which is a flexible substrate, may be made of a bendable or stretchable insulating material. For example, the upper substrate 120 may be made of a flexible material and may be made of the same material as the lower substrate 110, but is not limited thereto.

The polarizing layer 190, which is a configuration suppressing external light reflection of the stretchable display device 100, may overlap the upper substrate 120 and may be disposed on the upper substrate 120. However, the polarizing layer 190 is not limited thereto and, may be disposed under the upper substrate 120, or may be omitted, depending on the configuration of the stretchable display device 100.

Figure 2:
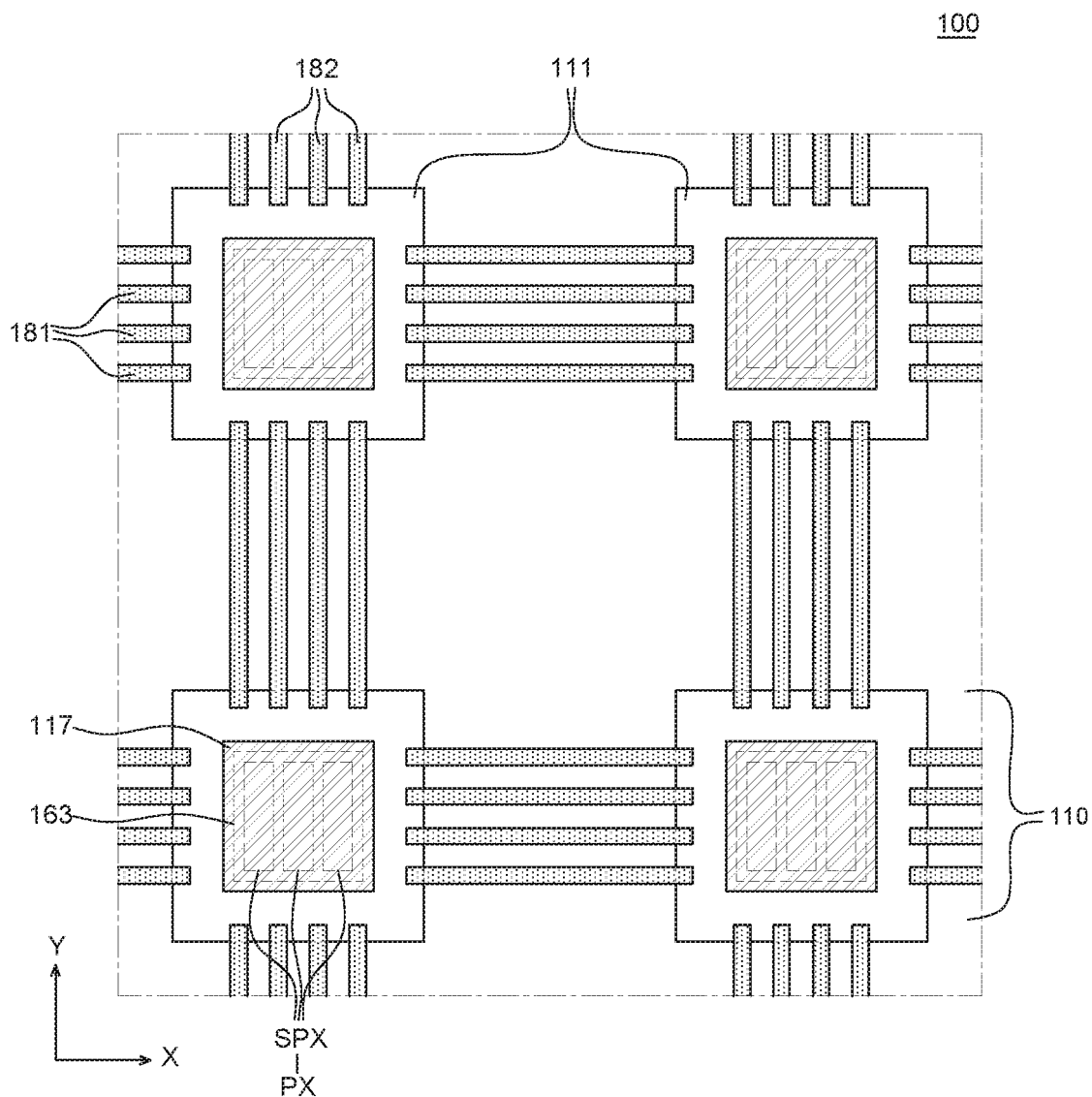
FIG. 2 is an enlarged plan view of the stretchable display device according to an embodiment of the present disclosure.
Figure 3:
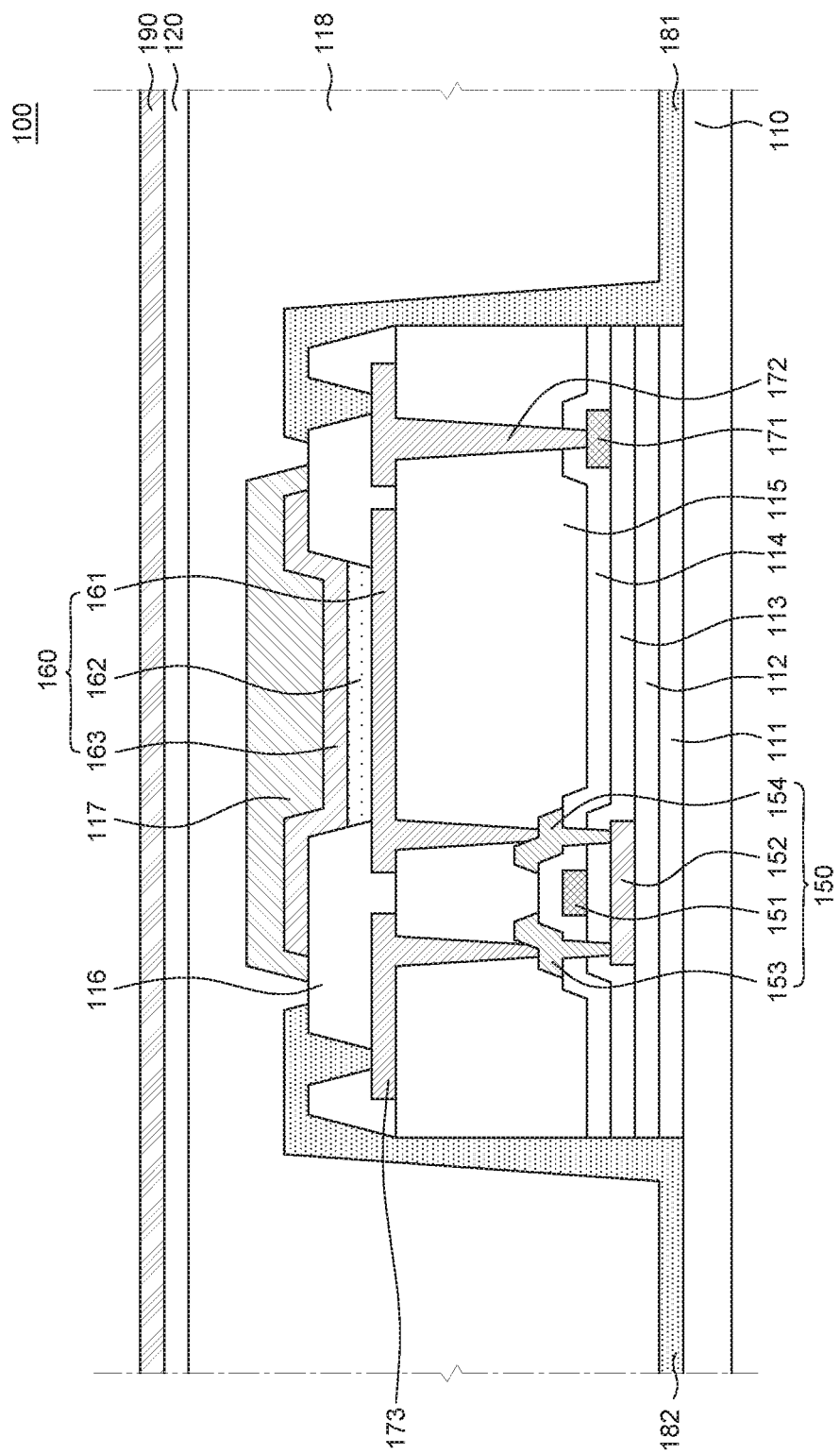
FIG. 3 is a schematic cross-sectional view of one subpixel of FIG. 1.

FIGS. 2 and 3 are referred to hereafter to describe in more detail the stretchable display device 100 according to an embodiment of the present disclosure.

Planar & Cross-Sectional Structure

FIG. 2 is an enlarged plan view of the stretchable display device according to an embodiment of the present disclosure. FIG. 3 is a schematic cross-sectional view of a subpixel of FIG. 1. FIG. 1 is referred to for the convenience of description.

Referring to FIGS. 2 and 3, the plurality of individual substrates 111 are disposed on the lower substrate 110. The plurality of individual substrates 111 are spaced apart from each other and disposed on the lower substrate 110. For example, the plurality of individual substrates 111, as shown in FIGS. 1 and 2, may be disposed in a matrix shape on the lower substrate 110, but are not limited thereto.

Referring to FIG. 3, a buffer layer 112 is disposed on the plurality of individual substrates 111. The buffer layer 112 is formed on the plurality of individual substrates 111 to protect various components of the stretchable display device 100 against permeation of water (H2O) and oxygen (O2) from the outside from the lower substrate 110 and the plurality of individual substrates 111. The buffer layer 112 may be made of an insulating material, and for example, may be made as a single inorganic layer or a multi-inorganic layer made of a silicon nitride (SiNx), a silicon oxide (SiOx), silicon oxynitride (SiON), etc. However, the buffer layer 112 may be omitted, depending on the structure or characteristics of the stretchable display device 100.

The buffer layer 112 may be formed only in the areas overlapped with the plurality of individual substrates 111. As described above, since the buffer layers 112 may be made of an inorganic material, they may be easily damaged, such as cracking, when the stretchable display device 100 is stretched. Accordingly, the buffer layer 112 is patterned in the shape of the plurality of individual substrates 111 without being formed in the areas between the plurality of individual substrates 111, whereby it may be formed only over the plurality of individual substrates 111. Therefore, since the buffer layer 112 is formed only in the areas overlapped with the plurality of individual substrates 111 that are rigid substrates, it is possible to suppress damage to the buffer layer 112 even though the stretchable display device 100 according to an embodiment of the present disclosure is deformed, such as, bending or stretching.

Referring to FIG. 3, a first transistor 150 including a first gate electrode 151, a first active layer 152, a first source electrode 153, and a first drain electrode 154 is formed on the buffer layer 112. For example, the first active layer 152 is formed on the buffer layer 112, and a gate insulating layer 113 for insulating the first active layer 152 and the first gate electrode 151 from each other is formed on the first active layer 152. An inter-layer insulating layer 114 for insulating the first gate electrode 151 from the first source electrode 153 and the first drain electrode 154 is formed, and the first source electrode 153 and the first drain electrode 154 that are respectively in contact with the first active layer 152 are formed on the inter-layer insulating layer 114.

The gate insulating layer 113 and the inter-layer insulating layer 114 may be formed only in the areas overlapped with the plurality of individual substrates 111 by patterning. The gate insulating layer 113 and the inter-layer insulating layer 114 may also be made of an inorganic material, equally to the buffer layer 112, so they may be easily damaged such as cracking when the stretchable display device 100 is stretched. Accordingly, the gate insulating layer 113 and the inter-layer insulating layer 114 are patterned in the shape of the plurality of individual substrates 111 without being formed in the areas between the plurality of individual substrates 111, whereby they may be formed only on the plurality of individual substrates 111.

Only a driving transistor of various transistors that may be included in the stretchable display device 100 is shown in FIG. 3 for the convenience of description, but a switching transistor, a capacitor, etc., may be included in the display device. Further, although the first transistor 150 is described as having a coplanar structure in this specification, various transistors, for example, having a staggered structure also may be used.

Referring to FIG. 3, a gate pad 171 is disposed on the gate insulating layer 113. The gate pad 171 is a pad for transmitting a gate signal to a plurality of subpixels SPX. The gate pad 171 may be made of the same material as the first gate electrode 151, but is not limited thereto.

Referring to FIG. 3, a planarization layer 115 is formed on the first transistor 150 and the inter-layer insulating layer 114. The planarization layer 115 planarizes the top of the first transistor 150. The planarization layer 115 may be composed of a single layer or a plurality of layers and may be made of an organic material. For example, the planarization layer 115 may be made of an acrylic-based organic material, but is not limited thereto. The planarization layer 115 may have a contact hole for electrically connecting the first transistor 150 and an anode 161, a contact hole for electrically connecting a data pad 173 and the first source electrode 153, and a contact hole for electrically connecting a connecting pad 172 and a gate pad 171.

In some embodiments, a passivation layer may be formed between the first transistor 150 and the planarization layer 115. That is, a passivation layer covering the first transistor 150 may be formed to protect the first transistor 150 from permeation of water, oxygen, etc. The passivation layer may be made of an inorganic material and may be composed of a single layer or a multi-layer, but is not limited thereto.

Referring to FIG. 3, the data pad 173, the connecting pad 172, and a light emitting element are disposed on the planarization layer 115. The light emitting element may be any one of an organic light emitting element and a LED. It is to be noted that, although the organic light emitting element 160 is exemplified as the light emitting element in FIG. 3 as well as other figures, the light emitting elements of the stretchable display device according to the present disclosure may also be LEDs or other types of light emitting element.

The data pad 173 may transmit a data signal from a connecting line 180, which functions as a data line, to a plurality of subpixels SPX. The data pad 173 is connected with the first source electrode 153 of the first transistor 150 through a contact hole formed at the planarization layer 115. The data pad 173 may be made of the same material as the anode 161 of the organic light emitting element 160, but is not limited thereto. Further, the data pad 173 may be made of the same material as the first source electrode 153 and the first drain electrode 154 of the first transistor 150, not on the planarization layer 115, but on the inter-layer insulating layer 114.

The connecting pad 172 may transmit a gate signal from a connecting line 180, which functions as a gate line, to a plurality of subpixels SPX. The connecting pad 172 is connected with the gate pad 171 through contact holes formed at the planarization layer 115 and the inter-layer insulating layer 114 and transmits a gate signal to the gate pad 171. The connecting pad 172 may be made of the same material as the data pad 173, but is not limited thereto.

The organic light emitting elements 160 are components disposed to correspond to a plurality of subpixel SPX, respectively, and emit light having a specific wavelength band. That is, the organic light emitting element 160 may be a blue organic light emitting element that emits blue light, a red organic light emitting element that emits red light, a green organic light emitting element that emits green light, or a white organic light emitting element that emits white light, but is not limited thereto. When the organic light emitting element 160 is a white organic light emitting element, the stretchable display device 100 may further include a color filter.

The organic light emitting element 160 includes an anode 161, an organic light emitting layer 162, and a cathode 163. In detail, the anode 161 is disposed on the planarization layer 115. The anode 161 is an electrode configured to supply holes to the organic light emitting layer 162. The anode 161 may be made of a transparent conductive material with a high work function. The transparent conductive material may include an Indium Tin Oxide (ITO), an Indium Zinc Oxide (IZO), and an Indium Tin Zinc Oxide (ITZO). The anode 161 may be made of the same material as the data pad 173 and the connecting pad 172 disposed on the planarization layer 151, but is not limited thereto. When the stretchable display device 100 is implemented in a top emission type, the anode 161 may further include a reflective plate.

The anodes 161 are spaced respectively for subpixels SPX and electrically connected with the first transistor 150 though a contact hole of the polarization layer 115. For example, although the anode 161 was shown as being electrically connected with the first drain electrode 154 of the first transistor 150 in FIG. 2, it may be electrically connected with the first source electrode 153.

A bank 116 is formed on the anode 161, the data pad 173, the connecting pad 172, and the planarization layer 115. The bank 116 is a component separating adjacent subpixels SPX. The bank 116 is disposed to cover at least partially both sides of adjacent anodes 161, thereby partially exposing the top surfaces of the anode 161. The bank 116 may suppress the problem that an unexpected subpixel SPX emits light or colors are mixed by light emitted in the lateral direction of the anode 161 due to concentration of a current on the corner of the anode 161. The bank 116 may be made of acrylic-based resin, benzocyclobutene (BCB)-based resin, or polyimide, but is not limited thereto.

The bank 116 has a contact hole for connecting the connecting line 180 functioning as a data line and the data pad 173 and a contact hole for connecting the connecting line 180 functioning as a gate line and the connecting pad 172.

The organic light emitting layer 162 is disposed on the anode 161. The organic light emitting layer 162 is configured to emit light. The organic light emitting layer 162 may include a luminescent material, and the luminescent material may include a phosphorous material or a fluorescent material, but is not limited thereto.

The organic light emitting layer 162 may be composed of one light emitting layer. Alternatively, the organic light emitting layer 162 may have a stacked structure in which a plurality of light emitting layers is stacked with a charge generation layer therebetween. The organic light emitting layer 162 may further include at least one organic layer of a hole transporting layer, an electron transporting layer, a hole blocking layer, an electron blocking layer, a hole injection layer, and an electron injection layer.

Referring to FIGS. 2 and 3, the cathode 163 is disposed on the organic light emitting layer 162. The cathode 163 supplies electrons to the organic light emitting layer 162. The cathode 163 may be made of Indium Tin Oxide (ITO)-based, Indium Zin Oxide (IZO)-based, Indium Tin Zinc Oxide (ITZO)-based, Zinc Oxide (ZnO)-based, and Tin Oxide (TO)-based transparent conductive oxides or an Ytterbium (Yb) alloy. Alternatively, the cathode 163 may be made of a metal material.

The cathodes 163 may be formed by patterning to respectively overlap the plurality of individual substrates 111. That is, the cathodes 163 may be disposed not in the areas between the plurality of individual substrates 111, but only in the areas overlapped with the plurality of individual substrates 111. Since the cathodes 163 are made of a transparent conductive oxide, a metal material, etc., when the cathodes 163 are formed even in the areas between the plurality of individual substrates 111, the cathodes 163 may be damaged when the stretchable display device 100 is stretched/contracted. Accordingly, the cathodes 163 may be formed to respectively correspond to the plurality of individual substrates 111 on the plane. Referring to FIGS. 2 and 3, the cathodes 163 may have an area not overlapped with the area where a connection line 180 is disposed, of the areas overlapped with the plurality of individual substrates 111.

Unlike common organic light emitting display devices, the cathodes 163 are formed by patterning to correspond to the plurality of individual substrate 111 in the stretchable display device 100 according to an embodiment of the present disclosure. Accordingly, each of the cathodes 163 disposed on the plurality of individual substrates 111 may be independently supplied with low-potential power through the connecting lines 180.

Referring to FIGS. 2 and 3, an encapsulation layer 117 is disposed on the organic light emitting element 160. The encapsulation layer 117 can seal the organic light emitting element 160 by covering the organic light emitting element 160 in contact with a portion of the top surfaces of the bank 116. Accordingly, encapsulation layer 117 protects the organic light emitting element 160 from water, air, or physical shock that may permeate from the outside.

The encapsulation layers 117 respectively cover the cathodes 163 patterned to respectively overlap the plurality of individual substrate 111 and may be formed on the plurality of individual substrates 111, respectively. That is, the encapsulation layers 117 are disposed to each cover one cathode 163 on one individual substrate 111 and the encapsulation layers 117 disposed on each of the plurality of individual substrates 111 may be spaced apart from each other.

The encapsulation layer 117 may be formed only in the areas overlapped with the plurality of individual substrates 111. As described above, since the encapsulation layers 117 may be configured to include an inorganic layer, they may be easily damaged, such as cracking, when the stretchable display device 100 is stretched. In particular, since the organic light emitting element 160 is vulnerable to water or oxygen, when the encapsulation layer 117 is damaged, reliability of the organic light emitting element 160 may be reduced. Therefore, since the encapsulation layer 117 is not formed in the areas between the plurality of individual substrates 111 in the stretchable display device 100 according to an embodiment of the present disclosure, damage to the encapsulation layer 117 can be minimized even though the stretchable display device 100 according to an embodiment of the present disclosure is deformed, such as, bending or stretching.

Compared with common flexible organic light emitting display devices of the related art, the stretchable display device 100 according to an embodiment of the present disclosure has a structure in which the plurality of individual substrates 111 that are relatively rigid are spaced apart from each other and disposed on the lower substrate 110 that is relatively soft and flexible. The cathodes 163 and the encapsulation layers 117 of the stretchable display device 100 are disposed by patterning to correspond to the plurality of individual substrates 111, respectively. That is, the stretchable display device 100 according to an embodiment of the present disclosure may have a structure that enables the stretchable display device 100 to be more easily deformed when a user stretches or bends the stretchable display device 100 and may have a structure that can minimize damage to the components of the stretchable display device 100 when the stretchable display device 100 is deformed.

Connecting Line Composed of Base Polymer & Conductive Particle

The connecting lines 180 are lines that electrically connect the pads on the plurality of individual substrates 111. The connecting lines 180 include first connecting lines 181 and second connecting lines 182. The first connecting lines 181 are lines extending in an X-axial direction of the connecting lines 180 and the second connecting lines 182 are lines extending in a Y-axial direction of the connecting lines 180.

In common organic light emitting display devices, various lines such as a plurality of gate lines and a plurality of data lines are extended and disposed between a plurality of subpixels, and a plurality of subpixels are connected to one signal line. Accordingly, in common organic light emitting display devices, various lines such as gate lines, data lines, high-potential power lines, and reference voltage lines extend from a side to the other side of the organic light emitting display devices without disconnecting on the substrate.

However, in the stretchable display device 100 according to an embodiment of the present disclosure, various lines such as gate lines, data lines, high-potential power lines, and reference voltage lines, which are made of a metal material, are disposed only on the plurality of individual substrates 111. That is, in the stretchable display device 100 according to an embodiment of the present disclosure, various lines made of a metal material may be disposed only on the plurality of individual substrates 111 and may not be formed to be in contact with the lower substrate 110. Accordingly, various lines may be patterned to correspond to the plurality of individual substrates 111 and discontinuously disposed.

In the stretchable display device 100 according to an embodiment of the present disclosure, the pads on two adjacent individual substrates 111 may be connected by a connecting line 180 to connect the discontinuous lines. That is, a connecting line 180 electrically connects the pads on two adjacent individual substrates 111. Accordingly, the stretchable display device 100 of the present disclosure may include a plurality of connecting lines 180 to electrically connect various lines such as gate lines, data lines, high-potential power lines, and reference voltage lines between the plurality of individual substrates 111. For example, gate lines may be disposed on a plurality of individual substrates 111 disposed adjacent to each other in the X-axial direction, and the gate pad 171 may be disposed at both ends of the gate lines. At this time, each of the plurality of gate pads 171 on the plurality of individual substrates 111 disposed adjacent to each other in the X-axial direction may be connected to each other by a connecting line 180 functioning as a gate line. Accordingly, the gate line disposed on the plurality of individual substrates 111 and the connecting line 180 disposed on the lower substrate 110 may function as one gate line. Further, all various lines that may be included in the stretchable display device 100, such as the data lines, high-potential power lines, and reference voltage lines, also each may function as one line by a connecting line 180, as described above.

Referring to FIG. 2, a first connecting line 181 may connect the pads on two parallel individual substrates 111 of a plurality of individual substrates 111 disposed adjacent to each other in the X-axial direction. The first connecting line 181 may function as a gate line or a low-potential power line, but is not limited thereto. For example, the first connecting line 181 may function as a gate line and may electrically connect the gate pads 171 on two X-axially parallel individual substrates 111 through a contact hole formed at the bank 116. Accordingly, as described above, the gate pads 171 on a plurality of individual substrates 111 disposed in the X-axial direction may be connected by first connecting lines 181 that function as gate lines, and one gate signal may be transmitted.

Referring to FIG. 2, a second connecting line 182 may connect the pads on two parallel individual substrates 111 of a plurality of individual substrates 111 disposed adjacent to each other in the Y-axial direction. The second connecting line 182 may function as a data line, a high-potential power line, or a reference voltage line, but is not limited thereto. For example, the second connecting line 182 may function as a data line and can electrically connect the data pads 173 on two Y-axially parallel individual substrates 111 through a contact hole formed at the bank 116. Accordingly, as described above, the data pads 173 on a plurality of individual substrates 111 disposed in the Y-axial direction may be connected by the plurality of second connecting lines 182 that function as data lines, and one data signal may be transmitted.

Referring to FIG. 2, the connecting line 180 includes a base polymer (also referred to as base film) and conductive particles. In detail, the first connecting line 181 includes a base polymer and conductive particles and the second connecting line 182 includes a base polymer and conductive particles.

The first connecting line 181 may be formed by extending from the top surfaces of the lower substrate 110 to be in contact with the top and a side of the bank 116, and sides of the planarization layer 115, the inter-layer insulating layer 114, the gate insulating layer 113, and the buffer layer 112, which are disposed on the individual substrate 111, and sides of the plurality of individual substrates 111. Accordingly, the first connecting line 181 may be in contact with the top surfaces of the lower substrate 110, a side of an adjacent individual substrate 111, and sides of the buffer layer 112, the gate insulating layer 113, the inter-layer insulating layer 114, the planarization layer 115, and the bank 116 disposed on the adjacent individual substrates 111. The first connecting line 181 may be in contact with the connecting pads 172 disposed on adjacent individual substrates 111, but is not limited thereto.

The base polymer of the first connecting line 181 may be made of a bendable or stretchable insulating material similar to the lower substrate 110. The base polymer, for example, may include styrene butadiene styrene (SBS) etc., but is not limited thereto. Accordingly, when the stretchable display device 100 is bent or stretched, the base polymer cannot be damaged. The base polymer may be formed by coating a material for the base polymer or applying the material using a slit on the lower substrate 110 and an individual substrate 111.

The conductive particles of the first connecting line 181 may be distributed by the base polymer. In detail, the first connecting line 181 may include conductive particles distributed with predetermined density in the base polymer. The first connecting line 181, for example, may be formed by uniformly stirring conductive particles in a base polymer and then coating or hardening the base polymer with the conductive particles distributed therein onto the lower substrate 110 and the individual substrate 111, but is not limited thereto. The conductively particles may include at least one of silver (Ag), gold (Au), and carbon, but is not limited thereto.

The conductive particles distributed in the base polymer of the first connecting line 181 may form a conductive path electrically connecting the connecting pads 172 each disposed on adjacent individual substrates 111. Further, the conductive particles may form a conductive path electrically connecting a gate pad 171 formed on the outermost individual substrate 111 of the plurality of individual substrates 111 to a pad disposed in the non-active area NA.

Referring to FIG. 2, the base polymer and the conductive particles distributed in the base polymer of the first connecting line 181 may connect in a straight shape between the pads disposed on adjacent individual substrates 111. To this end, base polymers may be formed in a straight shape connecting between the pads disposed on each of a plurality of individual substrates 111 in the manufacturing process. Accordingly, the conductive paths formed by the conductive particles distributed in the base polymers also may be a straight shape. However, the shape and the process of forming the base polymer and the conductive particles of the first connecting line 181 may not be limited thereto.

Referring to FIG. 2, the second connecting line 182 may be formed by extending from the top surfaces of the lower substrate 110 to be in contact with the top and a side of the bank 116, and sides of the planarization layer 115, the inter-layer insulating layer 114, the gate insulating layer 113, and the buffer layer 112, which are disposed on the individual substrates 111, and the sides of the plurality of individual substrates 111. Accordingly, the second connecting line 182 can be in contact with the top surfaces of the lower substrate 110, a side of an adjacent individual substrate 111, and sides of the buffer layer 112, the gate insulating layer 113, the inter-layer insulating layer 114, the planarization layer 115, and the bank 116 disposed on the adjacent individual substrate 111. The second connecting line 182 may be in contact with the data pads 173 disposed on adjacent individual substrates 111, but is not limited thereto.

The base polymer of the second connecting line 182 may be made of a bendable or stretchable insulating material similar to the lower substrate 110, and may be made of the same material as the base polymer of the first connecting line 181. The base polymer, for example, may include styrene butadiene styrene (SBS) etc., but is not limited thereto.

Further, the conductive particles of the second connecting line 182 may be distributed in the base polymer. In detail, the second connecting line 182 may include conductive particles distributed with predetermined density in the base polymer. At this time, the conductive particles distributed at the upper portion and the lower portion in the base polymer of the second connecting line 182 may be substantially the same in density. Further, the manufacturing process of the second connecting line 181 may be the same as that of the first connecting line 181 or may be simultaneously performed.

The conductive particles distributed in the base polymer of the second connecting line 182 may form a conductive path electrically connecting the data pads 173 respectively disposed on adjacent individual substrates 111. Further, the conductive particles may form a conductive path electrically connecting a data pad 173 formed on the outermost individual substrate 111 of a plurality of individual substrates 111 to a pad disposed in the non-active area NA.

Referring to FIG. 2, the base polymer and the conductive particles distributed in the base polymer of the second connecting line 182 may connect in a straight shape between the pads disposed on adjacent individual substrates 111. To this end, base polymers may be formed in a straight shape connecting between the pads disposed on each of a plurality of individual substrates 111 in the manufacturing process. Accordingly, the conductive paths formed by the conductive particles distributed in the base polymers also may be a straight shape. However, the shape and the process of forming the base polymer and the conductive particles of the second connecting line 182 may not be limited thereto.

In some embodiments, the conductive particles distributed in the base polymer of the connecting line 180 may be distributed and disposed with a density gradient in the base polymer. The density of conductive particles decreases as it goes from the upper portion of a base polymer to the lower portion of the base polymer, so conductivity by conductive particles may be maximum at the upper portion of a base polymer. In detail, conductive particles may be injected and distributed in a base polymer by performing an ink printing process, which uses conductive precursors, etc., on the top surfaces of the base polymer. When the conductive particles are injected into the base polymer, the conductive particles may permeate into empty spaces of the base polymer while the polymer swells several times. Thereafter, the connecting line 180 may be formed by dipping the base polymer with the conductive particles injected into a reducing material or by reducing the base polymer by vapor. Accordingly, the density of the conductive particles in a permeation area at the upper portion of the base polymer may be high such that a conductive path can be formed. The thickness of the permeation area with conductive particles distributed with high density at the upper portion of the base polymer may depend on the time and intensity for injecting the conductive particles through the top surfaces of the base polymer. For example, when the time or intensity for injecting the conductive particles through the top surfaces of the base polymer increases, the thickness of the permeation area may increase. Each of the conductive particles may be in contact with each other at the upper portion of the base polymer, so a conductive path is formed by the conductive particles being in contact with each other, and accordingly, an electrical signal can be transmitted.

In some embodiments, the base polymer of the connecting line 180 may be formed as a single layer between adjacent individual substrates 111 on the lower substrate 110. In detail, a base polymer, unlike FIG. 2, may be disposed as a single layer between individual substrates 111, which are most adjacent to each other in the X-axial direction, in contact with the lower substrate 110. A base polymer may be formed to overlap all of a plurality of pads disposed in parallel at a side on one individual substrate 111. Conductive particles may be separately formed to form a plurality of conductive paths on a base polymer, which is one layer, and respectively correspond to a plurality of pads. Accordingly, conductive paths formed by conductive particles may connect in a straight shape between the pads disposed on adjacent individual substrates 111. For example, conductive particles may be injected to form four conductive paths on a base polymer disposed as one layer between a plurality of individual substrates 111.

Further, in some embodiments, the base polymers of the connecting lines 180 may be disposed in all areas excepting the areas where a plurality of individual substrates 111 is disposed. The base polymers may be disposed as single layer in contact with the lower substrate 110, on the plurality of rigid substrate of the lower substrate 110, that is, in the other areas excepting the areas overlapped with a plurality of individuals 111. Accordingly, since the other areas of the lower substrate 110 excepting the areas overlapped with a plurality of individual substrates 111 may be covered with base polymers and the base polymers may be in contact with the pads of the plurality of individual substrates 111, some of the base polymers may be disposed to cover edges of the plurality of individual substrates 111. Further, conductive particles may form a conductive path connecting the pads on a plurality of adjacent individual substrates 111 in the base polymer.

When base polymers are disposed as single layers in all areas excepting the areas disposed with a plurality of individual substrates 111 on the lower substrate 110, the base polymers may be formed by applying the base polymers to all areas excepting the areas disposed with the plurality of individual substrates 111 on the lower substrate 110. Accordingly, there may be no need for a separate process for patterning the base polymer. Accordingly, the process of manufacturing the base polymers and the connecting lines can be simplified, and the manufacturing costs and time can be reduced.

Further, since base polymers are disposed as single layers in all areas excepting the areas disposed with the plurality of individual substrates 111 on the lower substrate 110, the force that is applied when the stretchable display device 100 is bent or stretched can be distributed. Further, in some embodiments, the top surfaces of the base polymer of the connecting line 180 may be flat. In detail, unlike FIG. 3, the top surfaces of the base polymer of the connecting line 180 such as a gate line and a data line may be higher than the top surfaces of the planarization layer 115 on a plurality of individual substrates 111. Further, the top surfaces of the base polymer may be higher than the top surfaces of the bank 116 on the plurality of individual substrates 111. Accordingly, the height of the top surfaces of the portion overlapped with the plurality of individual substrates 111 and the height of the top surfaces of the areas disposed between the plurality of individual substrates 111 may be the same. Accordingly, the top surfaces of the connecting line 180 may be flat. Therefore, the top surfaces of the conductive particles distributed at the upper portion in the base polymer may be a straight or a straight-line shape without a curve in a cross-sectional view.

A step may exist between the top surfaces of the bank 116 and the top surfaces of the lower substrate 110 due to various components on the plurality of individual substrates 111 spaced and disposed on the lower substrate 110. In this case, the base polymer itself may be cut by a step on the top surfaces of the base polymer, so the electrical path between the pads on adjacent individual substrates 111 may be cut and a percentage defective of the stretchable display device may increase.

At this time, when the top surfaces of the base polymer is flat, the step between the top of the elements disposed on the plurality of individual substrates 111 and the top surfaces of the lower substrate 110 without the plurality of individual substrates 111 can be removed. Accordingly, a cutting phenomenon of the connecting lines 180 including a base polymer and conductive particles due to a step can be suppressed even though the stretchable display device 100 is bent or stretched. Further, the top surfaces of the base polymer is flat in a stretchable display device 100 according to another embodiment of the present disclosure, so damage to the connecting lines 180 in the manufacturing process of the stretchable display device 100 can be minimized.

Referring back to FIG. 3, the upper substrate 120, the polarizing layer 190, and the adhesive layer 118 are disposed on the encapsulation layer 117 and the lower substrate 110.

The upper substrate 120 is a substrate supporting various components disposed under the upper substrate 120. The upper substrate 120, which is a flexible substrate, may be made of a bendable or stretchable insulating material. The upper substrate 120, which is a flexible substrate, can reversibly expand and contract. Further, an elastic modulus may be several to hundreds of MPa and a tensile fracture rate may be 100% or more. The thickness of the upper substrate 120 may be 10 μm to 1 mm, but is not limited thereto.

The upper substrate 120 may be made of the same material as the lower substrate 110, for example, silicon rubber such as polydimethylsiloxane (PDMS) or an elastomer such as polyurethane (PU), so it can have flexibility. The material of the upper substrate 120, however, is not limited thereto.

The upper substrate 120 and the lower substrate 110 can be bonded through the adhesive layer 118 disposed under the upper substrate 120 by applying pressure to the upper substrate 120 and the lower substrate 110. However, the present disclosure is not limited thereto, and the adhesive layer 118 may be omitted, depending on embodiments.

The polarizing layer 190 is disposed on the upper substrate 120. The polarizing layer 190 can polarize light incident into the stretchable display device 100 from the outside. Light incident in the stretchable display device 100 and polarized through the polarizing layer 190 can be reflected in the stretchable display device 100, so the phase of the light can be changed. The light with the changed phase may not pass through the polarizing layer 190. Accordingly, light incident in the stretchable display device 100 from the outside of the stretchable display device 100 is not discharged back to the outside of the stretchable display device 100, so the external light reflection of the stretchable display device 100 can be reduced.

Stretching Characteristic by Plurality of Individual Substrates

A stretchable display device needs an easily bending or stretching characteristic, so there have been attempts to use substrates that are soft and flexible due to a small modulus. However, when a soft material or flexible material such as polydimethylsiloxane (PDMS) having a small modulus is used as a lower substrate that is disposed in the process of manufacturing light emitting elements, there is a problem that the substrate is damaged by high temperature, for example, temperature over 100° C. that is generated in the process of forming transistors and the light emitting elements due to the characteristic that a material having a small modulus is weak to heat.

Accordingly, light emitting elements should be formed on a substrate made of a material that can withstand high temperature, so damage to the substrate can be suppressed in the process of manufacturing the light emitting elements. Accordingly, there have been attempts to manufacture a substrate using materials that can withstand high temperature, which is generated in the manufacturing process, such as polyimide (PI). However, materials that can withstand high temperature are not soft or not flexible due to large modulus, so substrates are not easily bent or stretched when stretchable display devices are stretched.

Therefore, since the plurality of individual substrates 111 that are rigid substrates are disposed only in the areas where first transistors 150 or organic light emitting elements 160 are disposed in the stretchable display device 100 according to an embodiment of the present disclosure, damage to the plurality of individual substrates 111 due to high temperature in the process of manufacturing the first transistors 150 or the organic light emitting elements 160 can be suppressed.

Further, the lower substrate 110 and the upper substrate 120 that are flexible substrates may be disposed under and over the plurality of individual substrates 111 in the stretchable display device 100 according to an embodiment of the present disclosure. Accordingly, the other areas of the lower substrate 110 and the upper substrate 120 excepting the areas overlapped with the plurality of individual substrates 111 can be easily stretched or bent, so the stretchable display device 100 can be achieved. Further, it is possible to suppress damage to the first transistors 150, the organic light emitting elements 16, etc., disposed on the plurality of individual substrates 111 that are rigid substrates when the stretchable display device 100 is bent or stretched.

Effect of Connecting Line

Meanwhile, when a stretchable display device is bent or stretched, a lower substrate that is a flexible substrate is deformed and individual substrates that are rigid substrates on which organic light emitting elements are disposed may not be deformed. In this case, if the lines connecting each of the pads disposed on the plurality of individual substrates are not made of an easily bendable or stretchable material, the lines may be damaged, such as cracking, due to deformation of the lower substrate.

By contrast, in the stretchable display device 100 according to an embodiment of the present disclosure, it is possible to electrically connect the pads disposed on each of the plurality of individual substrates 111, using the connecting lines 180 including a base polymer and conductive particles. The base polymer is soft and flexible to be able to easily deform. Accordingly, the stretchable display device 100 of an embodiment of the present disclosure has an effect that even though the stretchable display device 100 is deformed such as bending or stretching, the areas between the plurality of individual substrates 111 can be easily deformed by the connecting lines 180 including the base polymer.

Further, according to the stretchable display device 100 of an embodiment of the present disclosure, since the connecting lines 180 include conductive particles, the conductive paths composed of the conductive particles cannot be damaged such as cracking even by deformation of the base polymer. For example, when the stretchable display device 100 is deformed such as bending or stretching, the lower substrate 110 that is a flexible substrate can be deformed in the other areas excepting the areas where the plurality of individual substrates 111 that are rigid substrates are disposed. At this time, the distance between the plurality of conductive particles disposed on the deforming lower substrate 110 may be changed. The density of the plurality of conductive particles disposed at the upper portion of the base polymers and forming the conductive paths can be maintained at a high level to be able to transmit electrical signals even though the distance between the plurality of conductive particles is increased. Accordingly, even if the base polymers are bent or stretched, the conductive paths formed by the plurality of conductive particles can smoothly transmit electrical signals. Further, even though the stretchable display device 100 is deformed such as bending or stretching, electrical signals can be transmitted between the pads respectively.

In the stretchable display device 100 according to an embodiment of the present disclosure, since the connecting lines 180 include a base polymer and conductive particles, the connecting lines 180 respectively connecting the pads disposed on the plurality of adjacent individual substrates 111 can be disposed in a straight shape to make a shortest distance. That is, the stretchable display device 100 can be achieved even if the connecting lines 180 are not formed in a curved shape. The conductive particles of the connecting lines 180 are distributed in the base polymers and form conductive paths. Further, when the stretchable display device 100 is deformed such as bending or stretching, the conductive paths formed by the conductive particles can be bent or stretched. In this case, only the distance between the conductive particles is changed and the conductive paths formed by the conductive particles can still transmit electrical signals. Therefore, in the stretchable display device 100 according to an embodiment of the present disclosure, it is possible to minimize the space occupied by the connecting lines 180.

Figure 4:
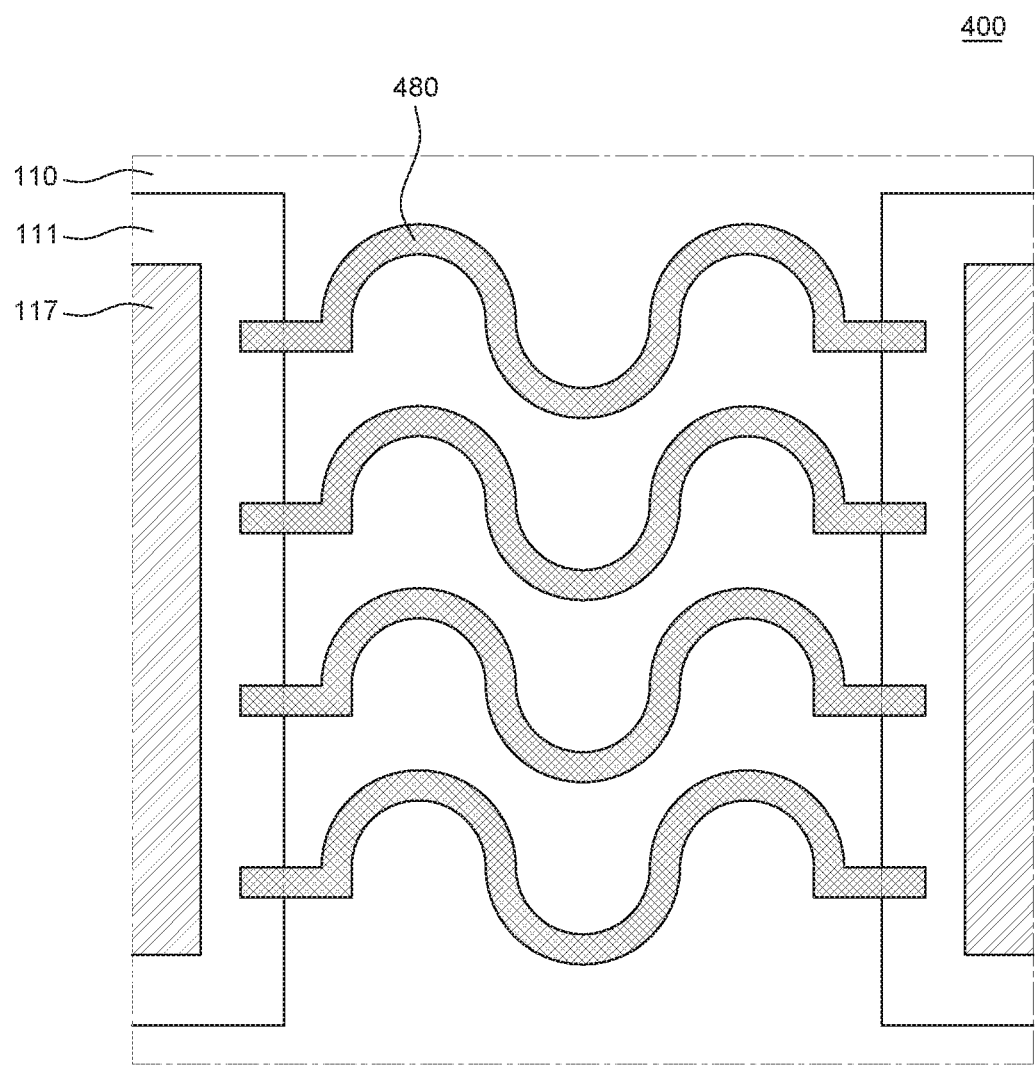
FIG. 4 is an enlarged plan view of the stretchable display device according to another embodiment of the present disclosure.
Figure 5:
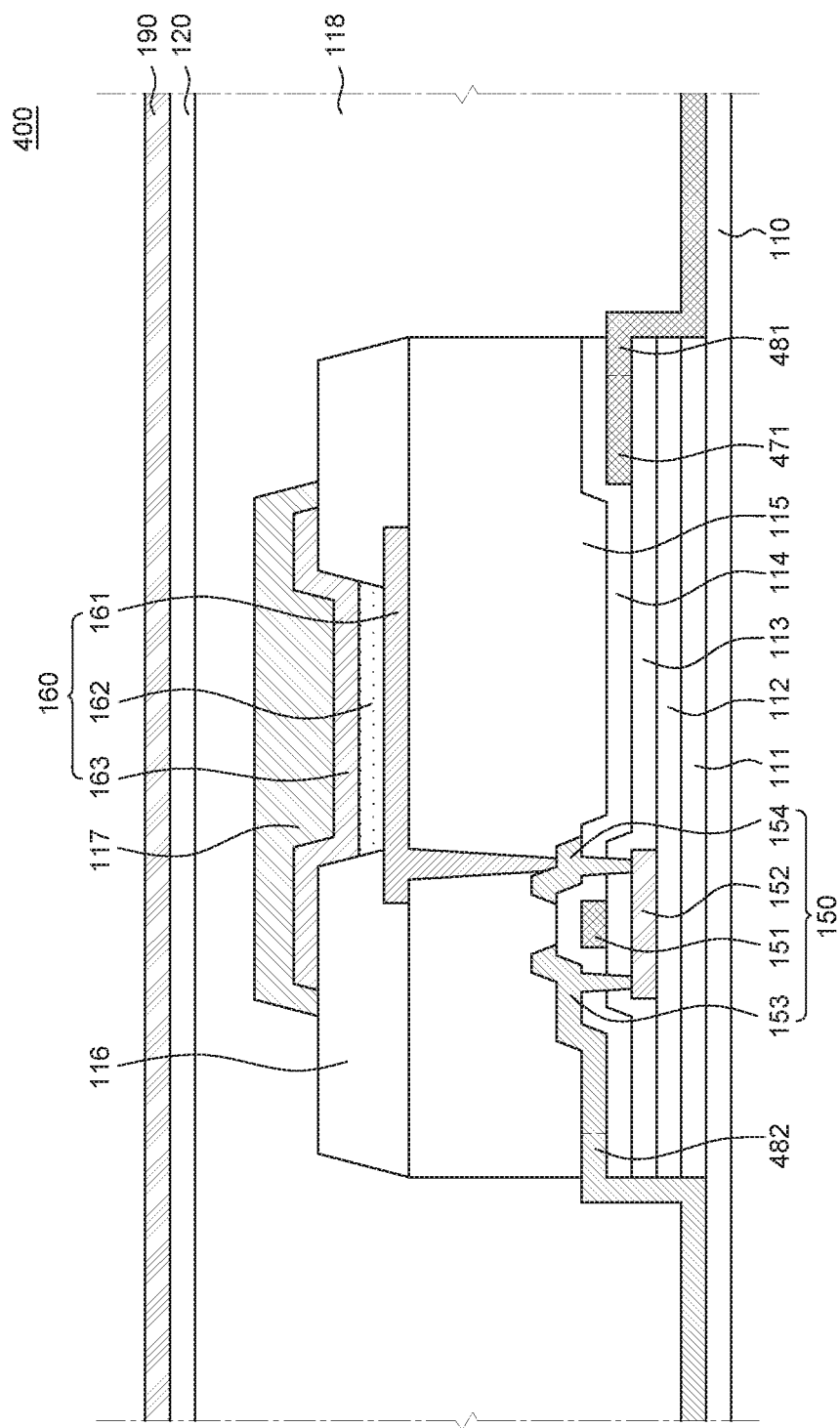
FIG. 5 is a cross-sectional view schematically showing one subpixel of the stretchable display device of FIG. 4.

Connecting Line Made of Same Material as Conductive Component and Having Curved Shape FIG. 4 is an enlarged plan view of the stretchable display device according to another embodiment of the present disclosure. FIG. 5 is a cross-sectional view schematically showing one subpixel of the stretchable display device of FIG. 4. A stretchable display device 400 shown in FIGS. 4 and 5 is substantially the same as the stretchable display device 100 shown in FIG. 3 except for having different connecting lines 480, so repeated description is omitted. Only encapsulation layers 117 of various components disposed on individual substrates 111, and connecting lines 480 were shown in FIG. 4 for the convenience of description.

Referring to FIG. 4, the connecting lines 480 of a stretchable display device 400 have a curved shape. The connecting lines 480 electrically connect the pads disposed on adjacent individual substrates 111 of a plurality of individual substrates 111 and extend not in a straight line, but in a curved shape between the pads respectively. For example, as shown in FIG. 4, the connecting lines 480 may have a sine waveform. However, the connecting lines 480 are not limited to this shape and may have various shapes. For example, the connecting lines 480 may have various shapes, for example, they may extend in a zigzag shape or a plurality of diamond-shaped connecting lines extend with the apexes connected.

Referring to FIG. 5, a gate pad 471 is formed on a gate insulating layer 113 and a first connecting line 481 is formed on the gate insulating layer 113 and the lower substrate 110.

Referring to FIG. 5, the first connecting line 481 that can function as a gate line is connected with the gate pad 471 and extends from the top surfaces of the gate insulating layer 113 to the top surfaces of the lower substrate 110. Accordingly, the first connecting lines 481 can electrically connect the gate pads 471 respectively formed on adjacent individual substrates 111. The first connecting line 481 is in contact with the lower substrate 110 between the plurality of individual substrates 111.

The first connecting line 481 and the gate pad 471 may be made of the same material as a gate electrode 151. Accordingly, the first connecting line 481 and the gate pad 471 may be simultaneously formed in the same process as the gate electrode 151. Accordingly, the first connecting line 481 may be integrally formed by extending from the gate pad 471 However, the present disclosure is not limited thereto, and the gate pad 471 and the first connecting line 481 may be made of different materials, and may be disposed on different layers and electrically connected.

Referring to FIG. 5, a second connecting line 482 that can function as a data line is formed on an inter-layer insulating layer 114. At this time, the source electrode 153 may extend outside the transistor 150, may function as a data pad, and may be electrically connected with the second connecting line 482. However, the present disclosure is not limited thereto and a separate pad may be defined as extending from the source electrode 153 or being electrically connected with the source electrode 153.

Further, the second connecting line 482 is connected with the source electrode 153 and extends from the top surfaces of an adjacent individual substrate 111 to the top surfaces of the lower substrate 110. Accordingly, the second connecting line 482 can electrically connect the data pad formed on each of adjacent individual substrates 111. The second connecting line 482 is in contact with the lower substrate 110 between the plurality of individual substrates 111.

The second connecting line 482 may be made of the same material as a data pad, that is, the source electrode 153. Accordingly, the second connecting line 482, the source electrode 153, and the drain electrode 154 may be simultaneously formed in the same process. Accordingly, the second connecting line 482 may be integrally formed by extending from the source electrode 153. However, the present disclosure is not limited thereto, and the second connecting line 482 and the source electrode 153 may be made of different materials, and may be disposed on different layers and electrically connected.

In the stretchable display device 400 according to another embodiment of the present disclosure, connecting lines 480 electrically connecting pads formed on the plurality of individual substrates 111, such as the first connecting line 481 and the second connecting line 482, may be made of the same material as at least one of a plurality of conductive components disposed on the plurality of individual substrates 111. For example, the first connecting line 481 may be made of the same material as the gate electrode 151 and the second connecting line 482 may be made of the same material as the source electrode 153. However, the present disclosure is not limited thereto and the connecting lines 480 may be made of the same material as, other than the gate electrode 151 and the source electrode 153, a drain electrode 154, the electrode of an organic light emitting element 160 such as an anode 161 and a cathode 163 of the organic light emitting element 160, and various lines included in the stretchable display device 400. Accordingly, the connecting lines 480 can be simultaneously formed in the manufacturing process of conductive components disposed on the plurality of individual substrates 111 and made of the same material as the connecting lines 480 in the stretchable display device 400 according to another embodiment of the present disclosure. Therefore, there may not be a need for a separate manufacturing process for forming the connecting lines 480.

Meanwhile, a conductive reinforcing member may be disposed under or over a predetermined area of the connecting lines 480 of FIGS. 4 and 5. The conductive reinforcing member is a component that suppresses damage or cutting of a connecting line when the stretchable display device 400 is repeatedly stretched, and comes in contact with a connecting line to help transmit an electrical signal even if the connecting line is cut.

The conductive reinforcing member may be a conductive polymer including a base polymer and conductive particles uniformly distributed in the base polymer. As a base polymer has an easily stretching property, the conductive reinforcing member may have flexibility.

The base polymer is a base layer in which conductive particles can be distributed, and may include styrene butadiene styrene (SBS), but is not limited thereto. Further, the conductive particles, which are particles having conductivity, may include at least one of silver (Ag), gold (Au), and carbon.

The conductive reinforcing member may be disposed under or over the connecting lines 480, adjacent to sides of the plurality of individual substrates 111. For example, the conductive reinforcing member may be in contact with the bottom of the connecting lines 480 and sides of the individual substrates 111, or may be in contact with the top surfaces of the connecting lines 480 and sides of the individual substrates 111.

A step may exist between the connecting line 480 disposed on the plurality of individual substrates 111 and the connecting line 480 disposed on the lower substrate 110 due to the thickness of various components disposed on the plurality of individual substrates 111. At this time, it is possible to minimize damage that may be applied to the connecting lines 480 by disposing a conductive reinforcing member including a base polymer having flexibility under or over the connecting lines 480 to be in contact with or adjacent to sides of the plurality of individual substrates 111.

Further, when a conductive reinforcing member is disposed between the connecting lines 480 and the lower substrate 110, the adhesive force between the connecting lines 480 and the lower substrate 110 can be increased and separation of the connecting lines 480 from the lower substrate 110 can be suppressed.

Further, when a conductive reinforcing member is disposed on the connecting lines 480, the conductive reinforcing member may be formed on the connecting lines 480 before the upper substrate 520 and a polarizing layer 190 are bonded by the adhesive layer 118 after all the connecting lines 480 and various components on the plurality of individual substrates 111 are formed. Accordingly, the conductive reinforcing member can be more easily manufactured, and the manufacturing time or costs can be minimized.

Meanwhile, the conductive reinforcing member may include liquid metal. The liquid metal means metal existing in a liquid state at room temperature. For example, the liquid metal may include at least one of gallium, indium, natrium, lithium, and an alloy thereof, but is not limited thereto. When a crack is generated in the connecting lines 480, the liquid metal can fill the crack of the connecting lines 480. Accordingly, since the conductive reinforcing member includes liquid metal, when the stretchable display device 400 is deformed such as bending or stretching and a crack is generated in the connecting lines 480, the crack is filled with the liquid metal, so disconnection of the connecting lines 480 can be minimized. Further, the liquid metal has conductivity, so the entire resistance in the connecting lines 480 and the liquid metal can be reduced. Accordingly, there is an effect that electrical signals can be more smoothly transmitted between the pads on the plurality of individual substrates 111.

Meanwhile, the conductive reinforcing member may be disposed in a peak area of the connecting lines 480. The peak area of the connecting lines 480 means an area where the amplitude of the curved connecting lines 480 is largest. For example, when the connecting lines 480 have a sine waveform, the point where the amplitude of the connecting lines 480 is largest may be defined as a peak area. When the stretchable display device 400 is deformed such as bending or stretching, stress may concentrate on the peak area of the connecting lines 480, as compared with other areas of the connecting lines 480. For example, the peak area may be top region and bottom region of the curved connecting lines 480.

At this time, the conductive reinforcing member may be disposed at the inner edge of the peak area of the connecting lines 480. The inner edge of the peak area of the connecting lines 480 may mean an area where a radius of curvature is relatively small in the peak area and the outer edge of the peak area may mean an area where the radius of curvature is relatively large in the peak area of the connecting lines 480. At this time, the conductive reinforcing member may be disposed at the inner edge of the peak area of the connecting lines 480 and under or over the connecting lines 480.

When the stretchable display device 400 is deformed such as bending or stretching, damage such as a crack or disconnection may be easily generated in the peak area of the connecting lines 480, particularly, at the inner edge of the peak area in comparison to other areas. At this time, even if damage is generated in the peak area of the connecting lines 480 or at the inner edge of the peak area, the conductive reinforcing member can suppress blocking of an electrical signal, so transmission of electrical signals in the stretchable display device 400 can be stably performed.

Additional Subpixel

Figure 6:
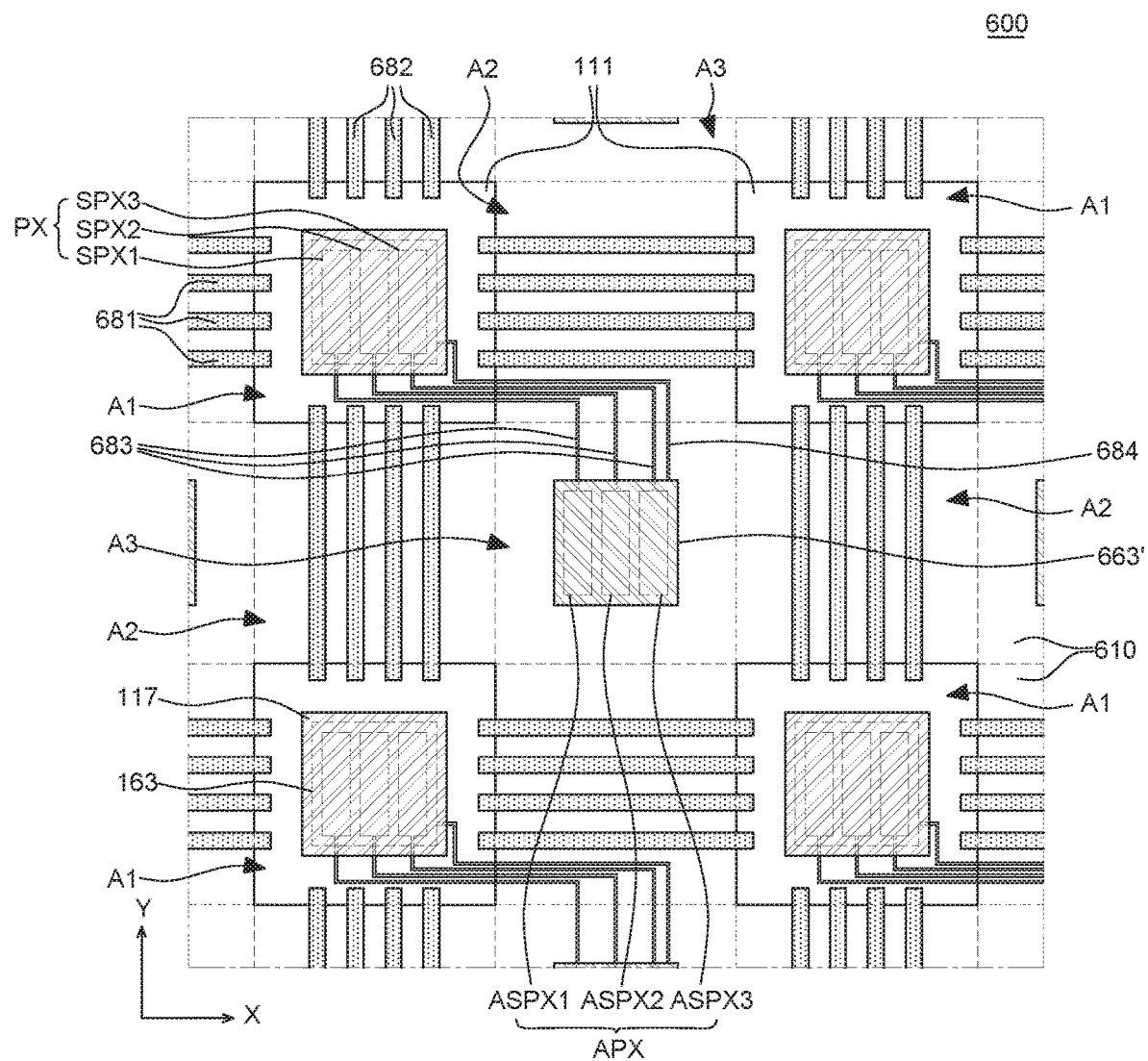
FIG. 6 is an enlarged plan view of the stretchable display device according to another embodiment of the present disclosure.
Figure 7A:
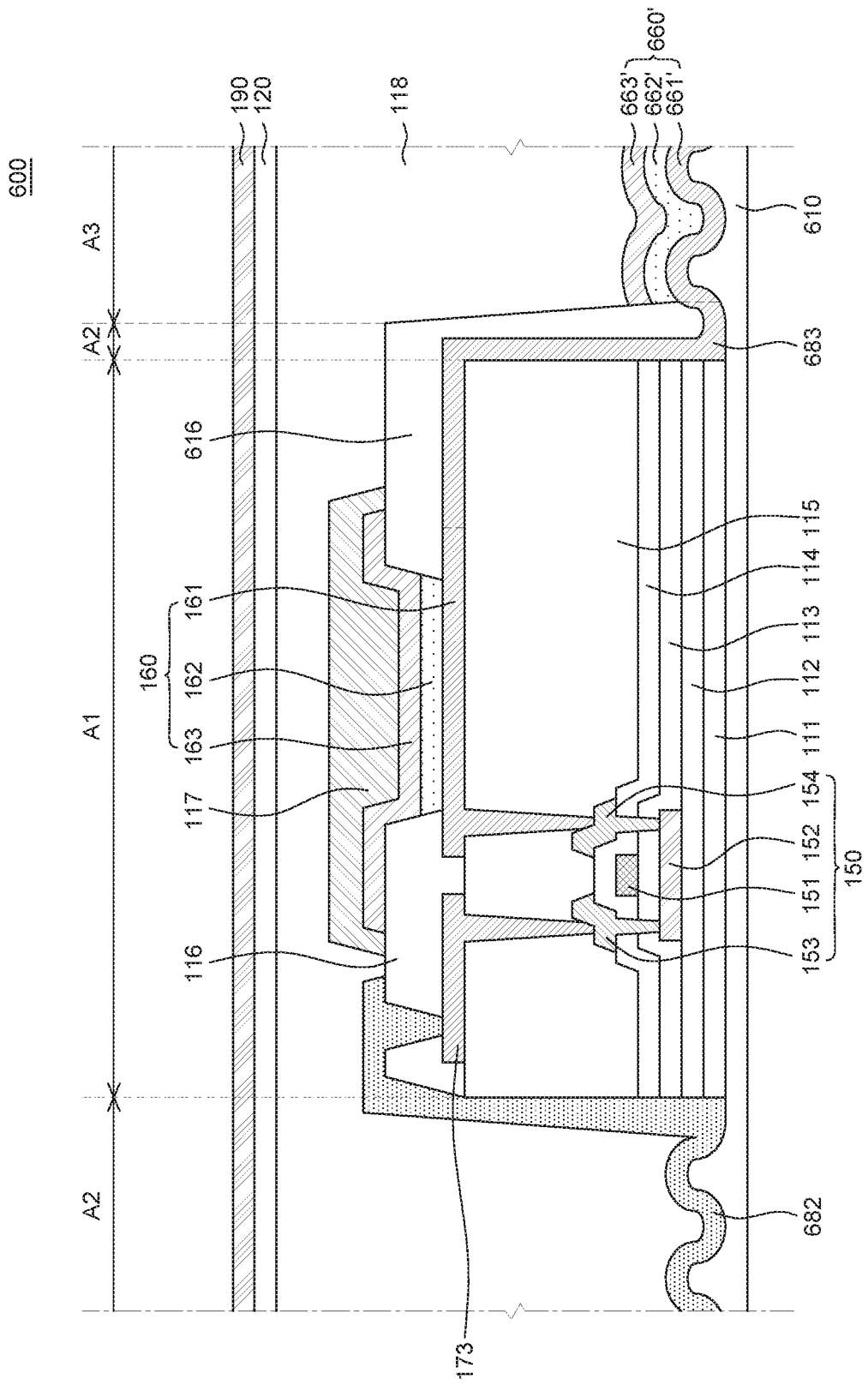
FIG. 7A is a schematic cross-sectional view about the stretchable display device of FIG. 6.
Figure 7B:
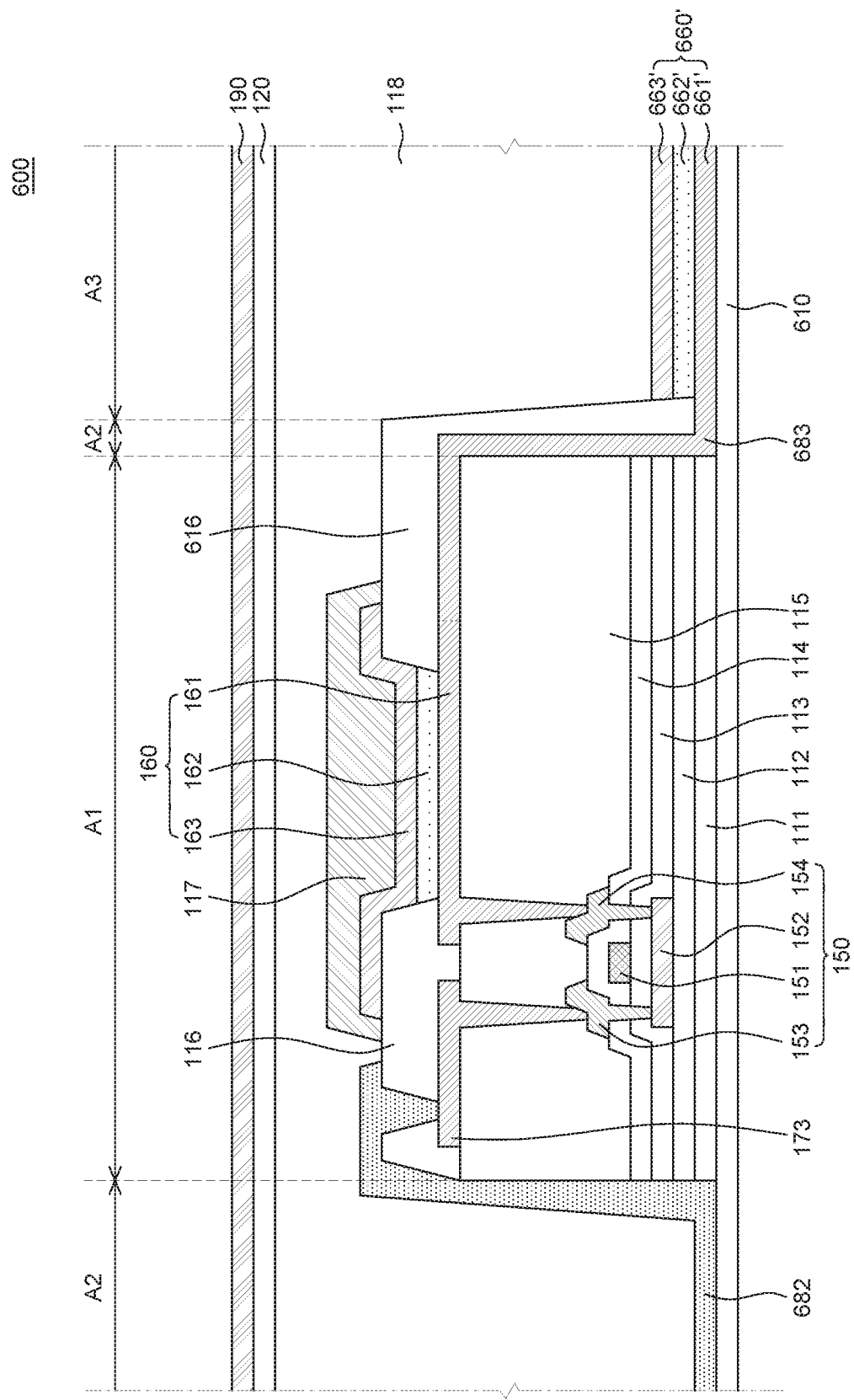
FIG. 7B is a schematic cross-sectional view about the case when the stretchable display device of FIG. 7A has been stretched.

FIG. 6 is an enlarged plan view of the stretchable display device according to another embodiment of the present disclosure. FIG. 7A is a schematic cross-sectional view about the stretchable display device of FIG. 6. FIG. 7B is a schematic cross-sectional view about the case when the stretchable display device of FIG. 7A has been stretched. A stretchable display device 600 shown in FIG. 6 is substantially the same as the stretchable display device 100 shown in FIGS. 1 to 3 except that the shape of the lower substrate 610, additional pixels APX disposed on the lower substrate 610, and a change of connecting lines 680, so repeated description is omitted.

Referring to FIG. 6, a plurality of first areas A1 in which a plurality of individual substrates 111 are disposed, a plurality of second areas A2 in which first connecting lines 681 and second connecting lines 682 of connecting lines 680 are disposed, and a plurality of third areas A3 that are areas excepting the first areas A1 and the second areas A2 and in which a plurality of additional pixels APX including a plurality of additional subpixels ASPX1, ASPX2, and ASPX3 are defined are defined on a lower substrate 610 of the stretchable display device 600.

Referring to FIGS. 6 and 7A, the plurality of first areas A1, which are areas in which the plurality of individual substrates 111 are disposed, are areas having rigidity. The plurality of first areas A1 are spaced apart from each other and defined on the lower substrate 610. For example, the plurality of first areas A1, as shown in FIG. 6, may be disposed in a matrix shape on the lower substrate 610, but are not limited thereto.

Referring to FIG. 7A, the top surfaces of the first area A1 of the lower substrate 610 is flat. That is, the first area A1 of the lower substrate 610 has no curve or unevenness, so the plurality of individual substrates 111 that are disposed on the first area A1 of the lower substrate 610 also can be disposed flat.

Referring to FIGS. 6 and 7A, organic light emitting elements 160 are disposed in each of the plurality of first areas A1 to respectively correspond to the plurality of subpixels SPX1, SPX2, and SPX3 of a pixel PX. In detail, a first organic light emitting element emitting red light may be disposed on the first subpixel SPX1, a second organic light emitting element emitting green light may be disposed on the second subpixel SPX2, and a third organic light emitting element emitting blue light may be disposed on the third subpixel SPX3. Further, a fourth organic light emitting element emitting white light may be additionally disposed. Accordingly, the plurality of first areas A1 may be referred to as first light emitting areas or first open areas.

Referring to FIG. 6, the plurality of second areas A2 are defined to be adjacent to the plurality of first areas A1. In detail, the plurality of second areas A2 are defined between two adjacent first areas A1. Accordingly, as shown in FIG. 6, a plurality of first areas A1 are defined at the upper side, lower side, left side, and right side of a second area A2. The plurality of second areas A2, which are areas where the first connecting lines 681 and the second connecting lines 682 of the connecting lines 680 are disposed, are areas having softness. That is, first connecting lines 681 and second connecting lines 682 connecting pads of a plurality of adjacent individual substrates 111 are disposed in the plurality of second areas A2. The plurality of second areas A2 are spaced apart from each other and defined on the lower substrate 610. For example, the plurality of second areas A2, as shown in FIG. 6, may be disposed in a matrix shape on the lower substrate 610, but are not limited thereto. Meanwhile, the second area A2 may be referred a line area in this specification.

Referring to FIG. 7A, the top surfaces of the second area A2 of the lower substrate 610 has an uneven shape. That is, the top surfaces of the second area A2 of the lower substrate 610 may be formed to be curved in a cross-section. Accordingly, the second connecting line 682 disposed on the second area A2 of the lower substrate 610 also may be formed to correspond to the uneven shape of the top surfaces of the second area A2. Accordingly, the second connecting line 682, for example, may be formed to have an uneven shape such as a sine waveform in the cross-section. Further, though not shown in FIG. 7A, the first connecting line 681 also may formed to correspond to the uneven shape of the top surfaces of the second area A2.

Referring to FIG. 6, the plurality of third areas A3 are defined in the portions surrounded by the plurality of first areas A1 and the plurality of second areas A2. Referring to FIG. 6, a second area A2 is defined at the upper side, lower side, right side, and left side of each of the plurality of third areas A3 and first areas A1 are defined to be adjacent in four diagonal directions.

Additional organic light emitting elements 660' may be disposed in each of the plurality of third areas A3 to respectively correspond to the plurality of additional subpixels ASPX1, ASPX2, and ASPX3. In detail, a first additional organic light emitting element emitting red light is disposed on a first additional subpixel ASPX1, a second additional organic light emitting element emitting green light is disposed on a second additional subpixel ASPX2, and a third additional organic light emitting element emitting blue light is disposed on a third additional subpixel ASPX3. Accordingly, the plurality of third areas A3 may be referred to as second light emitting areas or second open areas.

Referring to FIG. 7A, the top surfaces of the third area A3 of the lower substrate 610 has an uneven shape. That is, the top surfaces of the third area A3 of the lower substrate 610 may be formed to be curved in a cross-section. Accordingly, the additional organic light emitting element 660' disposed on the third area A3 of the lower substrate 610 also may be formed to correspond to the uneven shape of the top surfaces of the third area A3. Accordingly, an additional anode 661', an additional organic light emitting layer 662', and an additional cathode 663' of the additional organic light emitting element 660' may have an uneven shape corresponding to the third area A3 of the lower substrate 610. Meanwhile, the third area A3 may be referred to as second light emitting area in this specification.

Referring to FIGS. 6 and 7A, a plurality of connecting lines 680 are disposed on the lower substrate 610. In detail, the plurality of connecting lines 680 may include first connecting lines 681 and second connecting lines 682 that connect the pads of a plurality of adjacent individual substrates 111, third connecting lines 683 that connect the anode 161 of the organic light emitting element 160 disposed in one subpixel SPX1, SPX2, SPX3 of a first area A1 and the additional anode 661' of the additional organic light emitting element 660' disposed in one additional subpixel ASPX1, ASPX2, ASPX3 of a third area A3, and fourth connecting line 884 that connect the cathodes 163 of the organic light emitting elements 160 of a first area A1 and the additional cathodes 663' of the additional organic light emitting elements 660' of a third area A3.

Referring to FIGS. 6 and 7A, the first connecting lines 681 and the second connecting lines 682 can connect the pads of the plurality of individual substrates 111 disposed in the plurality of adjacent first areas A1 in the plurality of second areas A2. As shown in FIG. 7B, the first connecting lines 681 are extended and disposed in an X-axial direction and the second connecting lines 682 are extended and disposed in a Y-axial direction.

Referring to FIGS. 6 and 7A, the third connecting lines 683 may connect the anodes 161 disposed in the first areas A1 and the additional anodes 661' disposed in the third areas A3. Accordingly, the third connecting lines 683 may be made of the same material as the anodes 161 and the additional anodes 661'. For example, a third connecting line 683, the anode 161 of an organic light emitting element 160, and the additional anode 661' of an additional organic light emitting element 660' may be made of the same material simultaneously, whereby they may be integrated. However, the present disclosure is not limited thereto and the third connecting line 683 may be made of a different material from the anode 161 and the additional anode 661' through a separate process. For example, the third connecting lines 683 may be made of the same material as any one of the first gate electrode 151, the first source electrode 153, and the first drain electrode 154 of the first transistor 150.

Meanwhile, the third connecting lines 683 may connect the additional organic light emitting elements 660' of the plurality of additional subpixels ASPX1, ASPX2, and ASPX3 that emit light of the same color as the organic light emitting elements 160 of the plurality of subpixels SPX1, SPX2, and SPX3. That is, the third connecting lines 683 may connect the anode of the first organic light emitting element of a first subpixel SPX1 emitting red light and the additional anode of the first additional organic light emitting element of a first additional subpixel ASPX1 emitting red light. Further, third connecting lines 683 may connect the anode of the second organic light emitting element of a second subpixel SPX2 emitting green light and the additional anode of the second additional organic light emitting element of a second additional subpixel ASPX2 emitting green light. Further, third connecting lines 683 may connect the anode of the third organic light emitting element of a third subpixel SPX3 emitting blue light and the additional anode of the third additional organic light emitting element of a third additional subpixel ASPX3 emitting blue light. Accordingly, when any one of the plurality of subpixels SPX1, SPX2, and SPX3 emits light, an additional subpixel ASPX1, ASPX2, and ASPX3 that emits light of the same color may emit light together.

The third connecting line 683 is formed by extending from the top surfaces of a planarization layer 115 to the top surfaces of the lower substrate 610 in contact with sides of the planarization layer 115, an inter-layer insulating layer 114, a buffer layer 112, and a plurality of individual substrates 111. Further, the third connecting line 683 is in contact with the lower substrate 610 between the plurality of individual substrates 111 and the plurality of additional subpixels ASPX1, ASPX2, and ASPX3.

Referring to FIG. 7A, a bank 616 disposed on the plurality of individual substrates 111 extend to a partial area of the additional anode 661' of the additional organic light emitting element 660' disposed in the third area A3. In detail, the bank 616 is disposed to overlap only a partial area on the additional anode 661' of the additional organic light emitting element 660' in the third area A3. Accordingly, the bank 616 may perform a role in suppressing that the additional anode 661' and the additional cathode 663' of the additional organic light emitting element 660' are connected to each other by a short.

Referring to FIG. 7A, an additional organic light emitting element 662' is disposed on the additional anode 661' of the additional organic light emitting element 660'. The additional organic light emitting element 662' may have an uneven shape to correspond to the additional anode 661' of the additional organic light emitting element 660' having an uneven shape.

Further, an organic light emitting layer 162 of the organic light emitting element 160 of each of the plurality of subpixels SPX1, SPX2, and SPX3 may be made of the same material as an additional organic light emitting layer 662' of the additional organic light emitting element 660' of each of the plurality of additional subpixels ASPX1, ASPX2, and ASPX3 emitting the same color. The organic light emitting layer of the first organic light emitting element of the first subpixel SPX1 emitting red light and the additional organic light emitting layer of the first additional organic light emitting element of the first additional subpixel ASPX1 emitting red light are made of the same material. The organic light emitting layer of the second organic light emitting element of the second subpixel SPX2 emitting green light and the additional organic light emitting layer of the second additional organic light emitting element of the second additional subpixel ASPX2 emitting green light may be made of the same material. The organic light emitting layer of the third organic light emitting element of the third subpixel SPX3 emitting blue light and the additional organic light emitting layer of the third additional organic light emitting element of the third additional subpixel ASPX3 emitting blue light may be made of the same material.

Referring to FIG. 7A, an additional cathode 663' is disposed on the additional organic light emitting layer 662' of the additional organic light emitting element 660'. The additional cathode 663' may be formed by patterning to overlap each lower substrate 610 of the third areas A3. At this time, the additional cathode 663' may be disposed as a single cathode on the plurality of additional subpixels ASPX1, ASPX2, and ASPX3. Here, the additional cathode 663' has an uneven shape to correspond to the additional anode 661' of the additional organic light emitting element 660' having an uneven shape.

Meanwhile, the fourth connecting line 684 may connect the cathode 163 disposed in the first area A1 and the additional cathode 663' disposed in the third area A3. Accordingly, the fourth connecting lines 684 may be made of the same material as the cathode 163 and the additional cathode 663'. For example, as shown in FIG. 6, a fourth connecting line 684, the cathode 163 of an organic light emitting element 160, and the additional cathode 663' of an additional organic light emitting element 660' may be made of the same material simultaneously, whereby they may be integrated. However, the fourth connecting line 684 is not limited thereto and may be made of a different material from the cathode 163 and the additional cathode 663' through a separate process.

Referring to FIG. 7B, when the stretchable display device 600 is stretched, the connecting line 680 may be stretched together with the lower substrate 610. For example, as the lower substrate 610 is stretched, the second connecting line 682 and the third connecting line 683 that were formed in an uneven shape in the second area A2 and the third area A3 may become a straight shape while stretching.

Further, referring to FIG. 7B, when the stretchable display device 600 is stretched, the additional organic light emitting element 660' may be stretched together with the lower substrate 610. In detail, the additional anode 661', the additional organic light emitting layer 662', and the additional cathode 663' of the additional organic light emitting element 660' that had a curved shape may become a straight shape while stretching.

In general, when a stretchable display device is bent or stretched, a lower substrate composed of a flexible substrate is deformed and individual substrates composed of are rigid substrates on which organic light emitting elements are disposed may not be deformed. In this case, if the lines connecting respectively the pads disposed on the plurality of individual substrates are not made of an easily bendable or stretchable material, the lines may be damaged, such as cracking, due to deformation of the lower substrate.

Accordingly, an additional pixel APX is disposed in portions having no function as dummies in the lower substrate 61, that is, the third areas A3 that are the areas excepting the first areas A1 where the plurality of individual substrates 111 are disposed and the second areas A2 where the connecting lines 680 are disposed in the stretchable display device 600 according to another embodiment of the present disclosure. Accordingly, it is possible to efficiently use the area of the stretchable display device 600 and it is also possible to increase the aperture ratio of the stretchable display device 600. For example, as shown in FIG. 6, when additional pixels APX are disposed in the stretchable display device 600, the aperture ratio can be increased twice. Accordingly, the luminance of the stretchable display device 600 according to another embodiment of the present disclosure can also be improved.

Further, in the stretchable display device 600 according to another embodiment of the present disclosure, the first transistors 150 disposed on the plurality of individual substrates 111 are shared by the pixels PX and the additional pixels APX. That is, when a first transistor 150 is driven, the organic light emitting element 160 and the additional organic light emitting element 660' that are connected to the same first transistor 150 both may be driven. Accordingly, in the stretchable display device 600 according to another embodiment of the present disclosure, an organic light emitting element 160 and an additional organic light emitting element 660' share one first transistor 150 disposed on a plurality of individual substrates 111 in the stretchable display device 600 according to another embodiment of the present disclosure, whereby it is possible to increase the aperture ratio of the stretchable display device 600 without adding a separate circuit unit.

Further, by forming additional pixels APX in the third areas A3 in the stretchable display device 600 according to another embodiment of the present disclosure, it is possible to suppress deterioration of image quality of the stretchable display device 600 even though the stretchable display device 600 is stretched. That is, when the additional pixels APX are not used, only the pixels PX disposed on the plurality of individual substrates 111 emit light and the areas between the plurality of individual substrates 111 are stretched when the stretchable display device 600 is stretched. Accordingly, the gaps between the plurality of individual substrates 111 may be increased in comparison to before stretching. Accordingly, the problem that the image quality of the stretchable display device 600 is deteriorated when the stretchable display device 600 is stretched may be generated. Accordingly, in the stretchable display device 600 according to another embodiment of the present disclosure, by disposing the additional pixels APX in the third areas A3, it is possible to keep the gaps between the light emitting areas constant even though the stretchable display device 600 is stretched. Accordingly, in the stretchable display device 600 according to another embodiment of the present disclosure, it is possible to minimize deterioration of the image quality of the stretchable display device 600 when the stretchable display device 600 is stretched.

Further, the additional organic light emitting elements 600' may have a curved shape in the state before the stretchable display device 600 according to another embodiment of the present disclosure is stretched. That is, the additional organic light emitting elements 660' also can have an uneven shape by the uneven shape of the lower substrate 610 disposed under the additional organic light emitting elements 660', so the optical extraction efficiency of the additional organic light emitting elements 660' can be improved.

Further, in the stretchable display device 600 according to another embodiment of the present disclosure, the top surfaces of the second areas A2 and the third areas A3 of the lower substrate 610 where the connecting lines 680 and the additional pixels APX are disposed have an uneven shape. Accordingly, it is possible to attenuate stress that is generated when the stretchable display device 600 is stretched. That is, the connecting lines 680 and the additional organic light emitting elements 660' disposed in the additional pixels APX have a shape corresponding to the uneven shape of the top surfaces of the second areas A2 and the third areas A3 of the lower substrate 610. Accordingly, the connecting lines 680 and the additional organic light emitting elements 660' can be easily stretched when the stretchable display device 600 is stretched. Further, by attenuating stress that may be generated in the connecting lines 680 and the additional organic light emitting elements 660', it is possible to minimize damage to the connecting lines 680 and the additional organic light emitting elements 660' and it is also possible to minimize an increase in resistance of the connecting lines 680.

Meanwhile, though not shown in FIGS. 6 to 7B, the lower substrate 610, the upper substrate 120, and the polarizing layer 190 of the stretchable display device 600 may include rigid patterns and soft patterns. In this regards, soft pattern is also referred as flexible pattern. For example, the lower substrate 610 may include rigid patterns disposed in the areas overlapped with the plurality of individual substrates 111, and soft patterns disposed in areas excepting the rigid patterns. Here, the rigid pattern is a pattern that has a higher modulus than the soft pattern and is relative rigid, and may have the same modulus as the plurality of individual substrates 111. Further, the upper substrate 120 and the polarizing layer 190 may include rigid patterns disposed in the areas overlapped with the plurality of individual substrates 111, and soft patterns disposed in areas excepting the rigid patterns. Accordingly, the lower substrate 610, the upper substrate 120, and the polarizing layer 190 in the areas overlapped with the plurality of individual substrates 111 have rigidity, whereas the lower substrate 610, the upper substrate 120, and the polarizing layer 190 in the areas not overlapped with the plurality of individual substrates 111 have softness. Therefore, only the areas not overlapped with the plurality of individual substrates 111 may be implemented to stretch when the stretchable display device 600 is stretched.

Additional Pixel Independently Driven from Pixel

Figure 8:
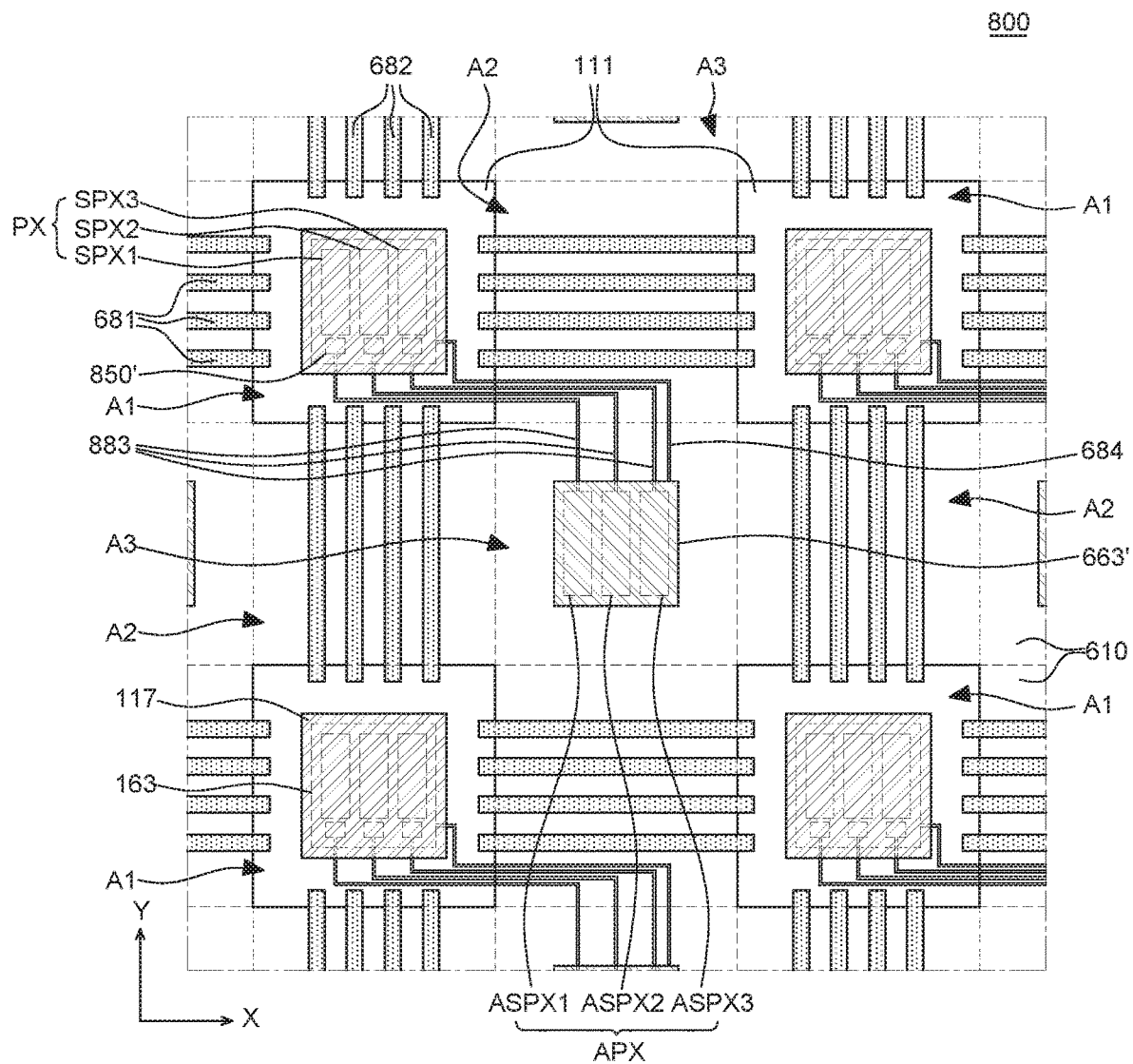
FIG. 8 is an enlarged plan view of a stretchable display device according to another embodiment of the present disclosure.
Figure 9:
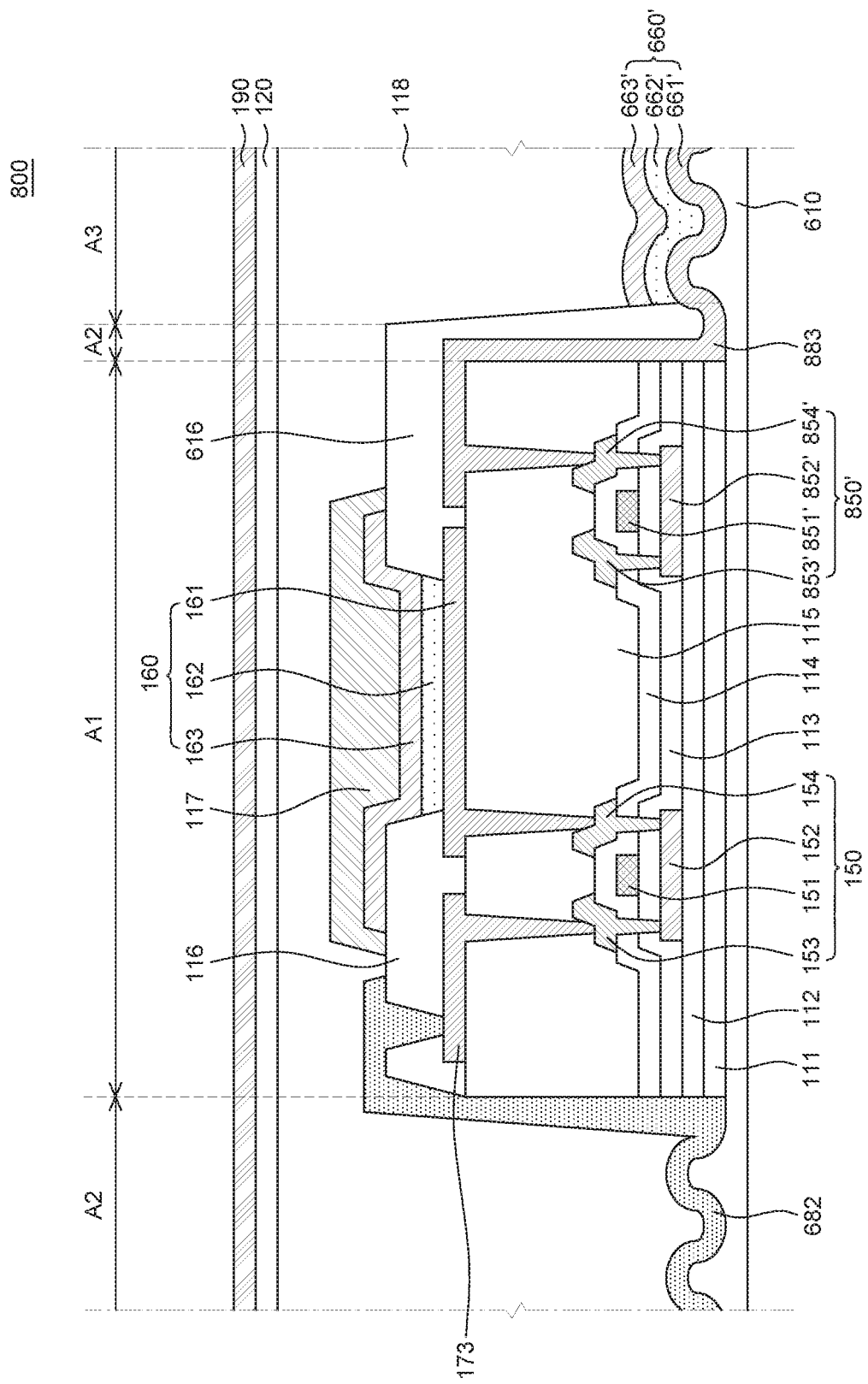
FIG. 9 is a schematic cross-sectional view about the stretchable display device of FIG. 8.

FIG. 8 is an enlarged plan view of a stretchable display device according to another embodiment of the present disclosure. FIG. 9 is a schematic cross-sectional view about the stretchable display device of FIG. 8. A stretchable display device 800 shown in FIGS. 8 and 9 is substantially the same as the stretchable display device 600 shown in FIGS. 6 to 7B except that second transistors 850' were added, so repeated description is omitted.

Referring to FIGS. 8 and 9, a second transistor 850' including a second gate electrode 851', a second active layer 852', a second source electrode 853', and a second drain electrode 854' is formed on the buffer layer 112. For example, the second active layer 852' is formed on the buffer layer 112, and a gate insulating layer 113 for insulating the second active layer 852' and the second gate electrode 851' is formed on the second active layer 852'. An inter-layer insulating layer 114 for insulating the second gate electrode 851', the second source electrode 853', and the second drain electrode 854' is formed, and the second source electrode 853' and the second drain electrode 854' that are respectively in contact with the second active layer 852' are formed on the inter-layer insulating layer 114.

Further, a planarization layer 115 is formed on the first transistor 150, the second transistor 850', and the inter-layer insulating layer 114. The planarization layer 115 planarizes the top surfaces of the first transistor 150 and the second transistor 850'. The planarization layer 115 may have a contact hole for electrically connecting the first transistor 150 and an anode 161, a contact hole for electrically connecting a data pad 173 and the first source electrode 153, and a contact hole for connecting the second drain electrode 854' and a third connecting line 883.

In some embodiments, a passivation layer may be formed between the first transistor 150, the second transistor 850', and the planarization layer 115. That is, a passivation layer covering the first transistor 150 and the second transistor 850' may be formed to protect the first transistor 150 and the second transistor 850' from permeation of water, oxygen, etc. The passivation layer may be made of an inorganic material and may be composed of a single layer or a multi-layer, but is not limited thereto.

Referring to FIG. 9, an additional organic light emitting element 660' connected with the second transistor 850' through a third connecting line 883 is disposed in a third area A3 of a lower substrate 610. An organic light emitting element 160 disposed on a plurality of individual substrates 111 and the additional organic light emitting element 660' are connected respectively to different transistors, so they can be independently driven.

Additional subpixels ASPX1, ASPX2, and ASPX3 of a stretchable display device 800 according to another embodiment of the present disclosure are connected to a different circuit from subpixels SPX1, SPX2, and SPX3 disposed on the plurality of individual substrates 111. Accordingly, in the stretchable display device 800 according to another embodiment of the present disclosure, the additional subpixels ASPX1, ASPX2, and ASPX3 and the subpixels SPX1, SPX2, and SPX3 are independently driven, so resolution can be increased. For example, as shown in FIG. 8, when additional pixels APX are disposed in the stretchable display device 800, the resolution can be increased twice.

Flexible Encapsulation Layer

Figure 10:
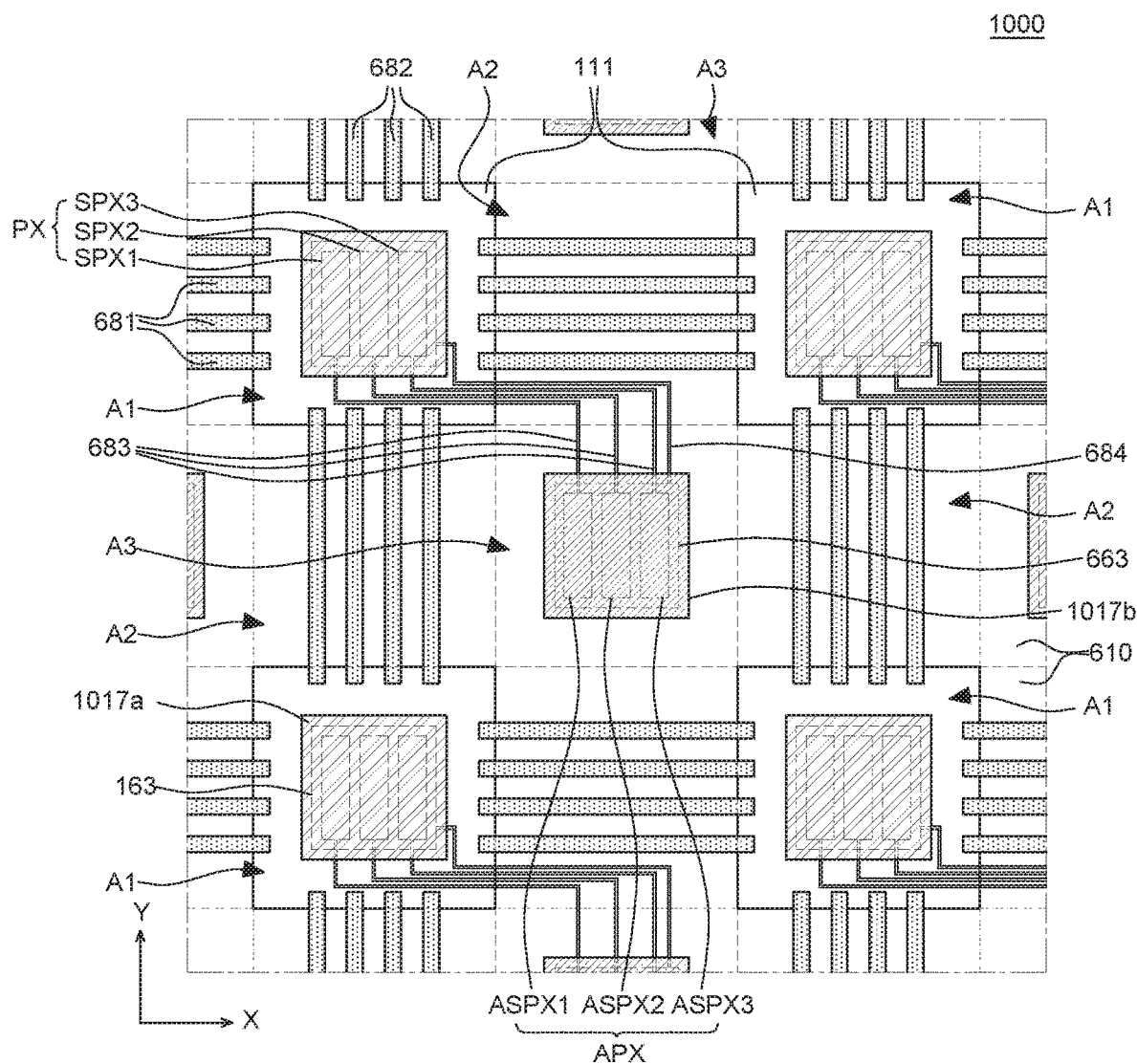
FIG. 10 is an enlarged plan view of a stretchable display device according to another embodiment of the present disclosure.
Figure 11:
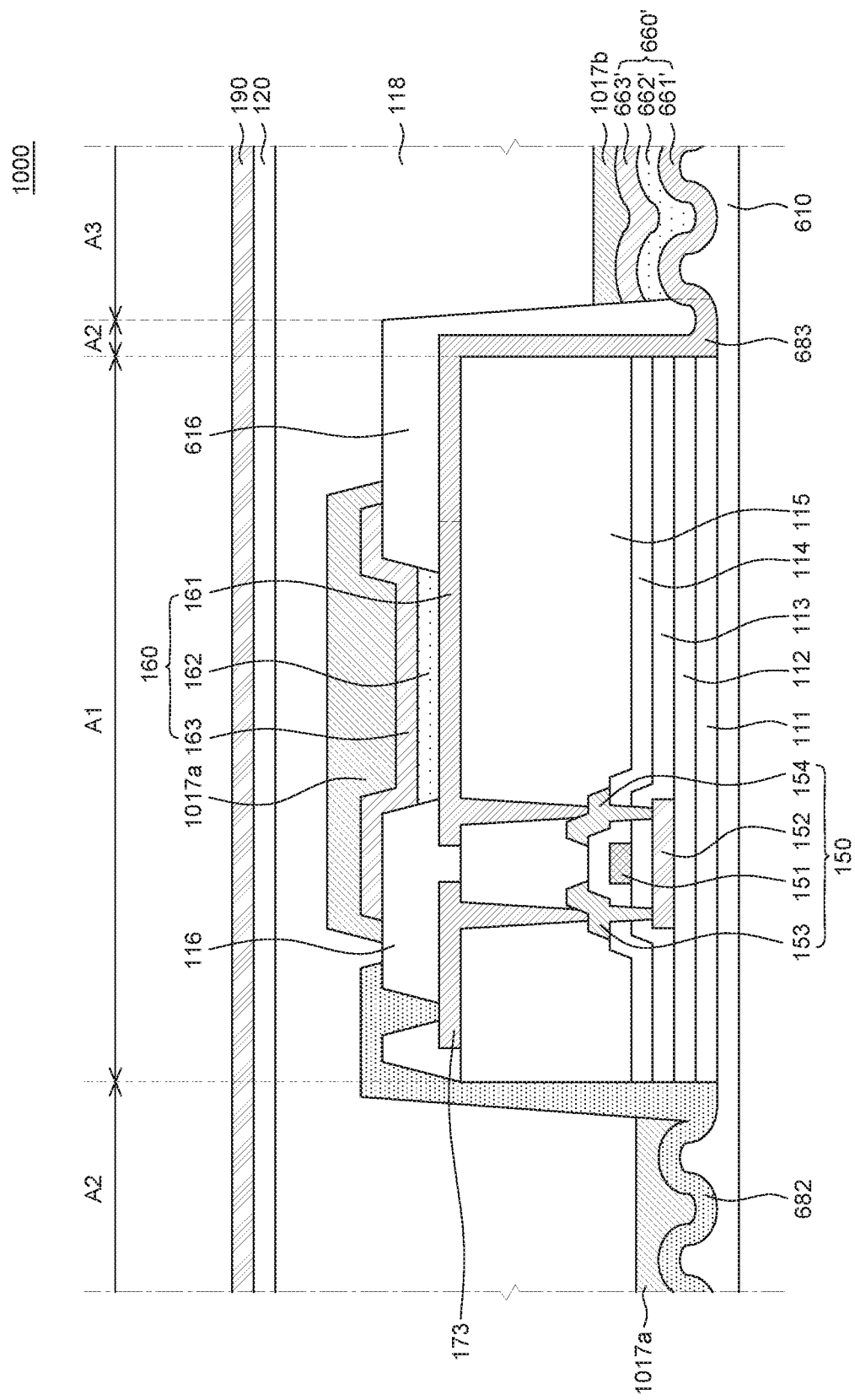
FIG. 11 is a schematic cross-sectional view about the stretchable display device of FIG. 10.
Figure 12:
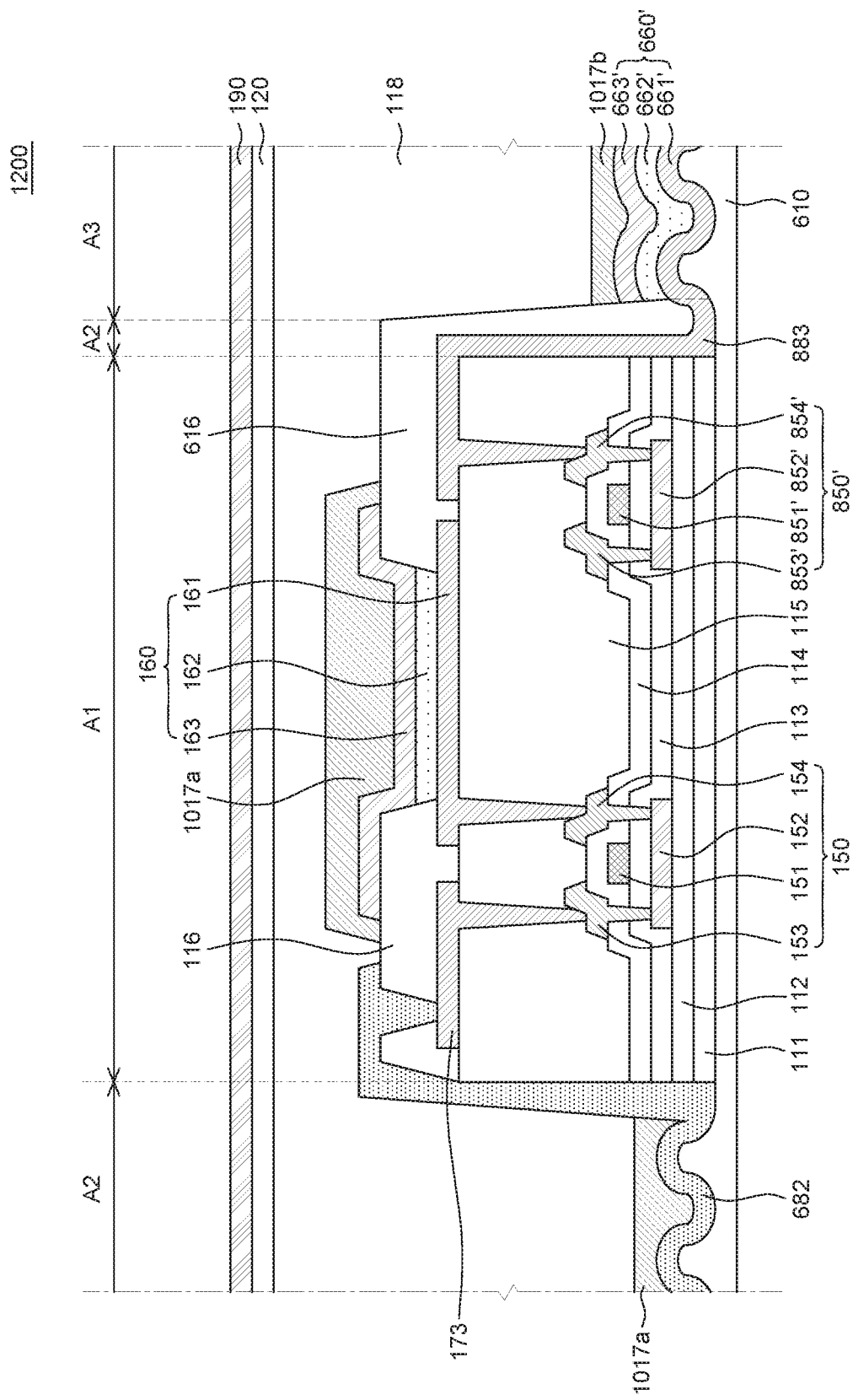
FIG. 12 is a schematic cross-sectional view about a stretchable display device according to another embodiment of the present disclosure.

FIG. 10 is an enlarged plan view of a stretchable display device according to another embodiment of the present disclosure. FIG. 11 is a schematic cross-sectional view about the stretchable display device of FIG. 10. FIG. 12 is a schematic cross-sectional view about a stretchable display device according to another embodiment of the present disclosure. A stretchable display device 1000 shown in FIGS. 10 and 11 is substantially the same as the stretchable display device 600 shown in FIGS. 6 to 7B except for having a different encapsulation layer 1017, so repeated description is omitted. Further, a stretchable display device 1200 shown in FIG. 12 is substantially the same as the stretchable display device 800 shown in FIGS. 8 to 9 except for having a different encapsulation layer 1017, so repeated description is omitted.

First, referring to FIGS. 10 and 11, an encapsulation layer 1017 includes a plurality of first encapsulation layers 1017a disposed on organic light emitting layers 160 disposed in first areas A1, and a plurality of second encapsulation layers 1017b disposed on connecting lines 680 and additional organic light emitting layers 660' disposed in second areas A2 and third areas A3 respectively. The first encapsulation layer 1017a can seal the organic light emitting element 160 by covering the organic light emitting element 160 in contact with a portion of the top surfaces of a bank 116. Further, the second encapsulation layer 1017b may be disposed to cover the connecting lines 680 disposed in the second areas A2 and may be disposed to cover the additional organic light emitting elements 660' disposed in third areas A3. However, the present disclose is not limited thereto. For example, the second encapsulation layer 1017b may not be disposed in the second areas A2 so as to minimize the damage to the encapsulation layer 1017 when the stretchable display device is deformed.

The encapsulation layer 1017 may be made of a material that is flexible, is excellent in elasticity, and can protect the organic light emitting element 160 and the additional organic light emitting element 660' from water, air, etc., that may permeate from the outside. That is, the encapsulation layer 1017 may be made of a soft encapsulation material. For example, the encapsulation layer 1017 may be made of graphene. Graphene, which is a material in which carbon atoms make a honeycomb structure in a plane, is very thin, transparent, and excellent in elasticity. Further, the encapsulation layer may be made of graphene oxide (GO) or reduced graphene oxide (rGO). However, the encapsulation layer is not limited thereto and various materials may be used for the encapsulation layer 1017 as long as the materials has excellent elasticity and can protect the organic light emitting element 160 and the additional organic light emitting element 660' from water, air, etc.

Further, referring to FIG. 12, the same as the stretchable display device 1000 described with reference to FIGS. 10 and 11, an encapsulation layer 1017 that is flexible, is excellent in elasticity, and can protect an organic light emitting element 160 and an additional organic light emitting element 660' from water, air, etc., that may permeate from the outside may be also used in a stretchable display device 1200.

In the stretchable display devices 1000 and 1200 according to other embodiments of the present disclosure, the encapsulation layer 1017 that is flexible, is excellent in elasticity, and can protect an organic light emitting element 160 and an additional organic light emitting element 660' from water, air, etc., that may permeate from the outside is formed. Accordingly, it is possible to effectively suppress damage to the encapsulation layer 1017, such as cracking, when the stretchable display devices 1000 and 1200 are stretched. Further, since the second encapsulation layer 1017b suppresses damage to the additional organic light emitting element 660' from water or oxygen, reliability of the additional organic light emitting element 660' can be improved.

In addition, since the encapsulation layer 1017 is not formed in the areas between the plurality of individual substrates 111 in the stretchable display devices 1000 and 1200 according to other embodiments of the present disclosure, damage to the encapsulation layer 1017 can be minimized even though the stretchable display device 1000 according to an embodiment of the present disclosure is deformed, such as, bending or stretching.

LED Disposed on Subpixel

Meanwhile, as described above, the stretchable display device according to an embodiment of the present disclosure is described by exemplifying an organic light emitting element as a light emitting element. However, the light emitting elements of the stretchable display device 1300 may be made of LEDs. Next, the structure of one subpixel in the case when the light emitting elements of the stretchable display device 1300 according to an embodiment of the present disclosure are LEDs is described hereafter.

Figure 13A:
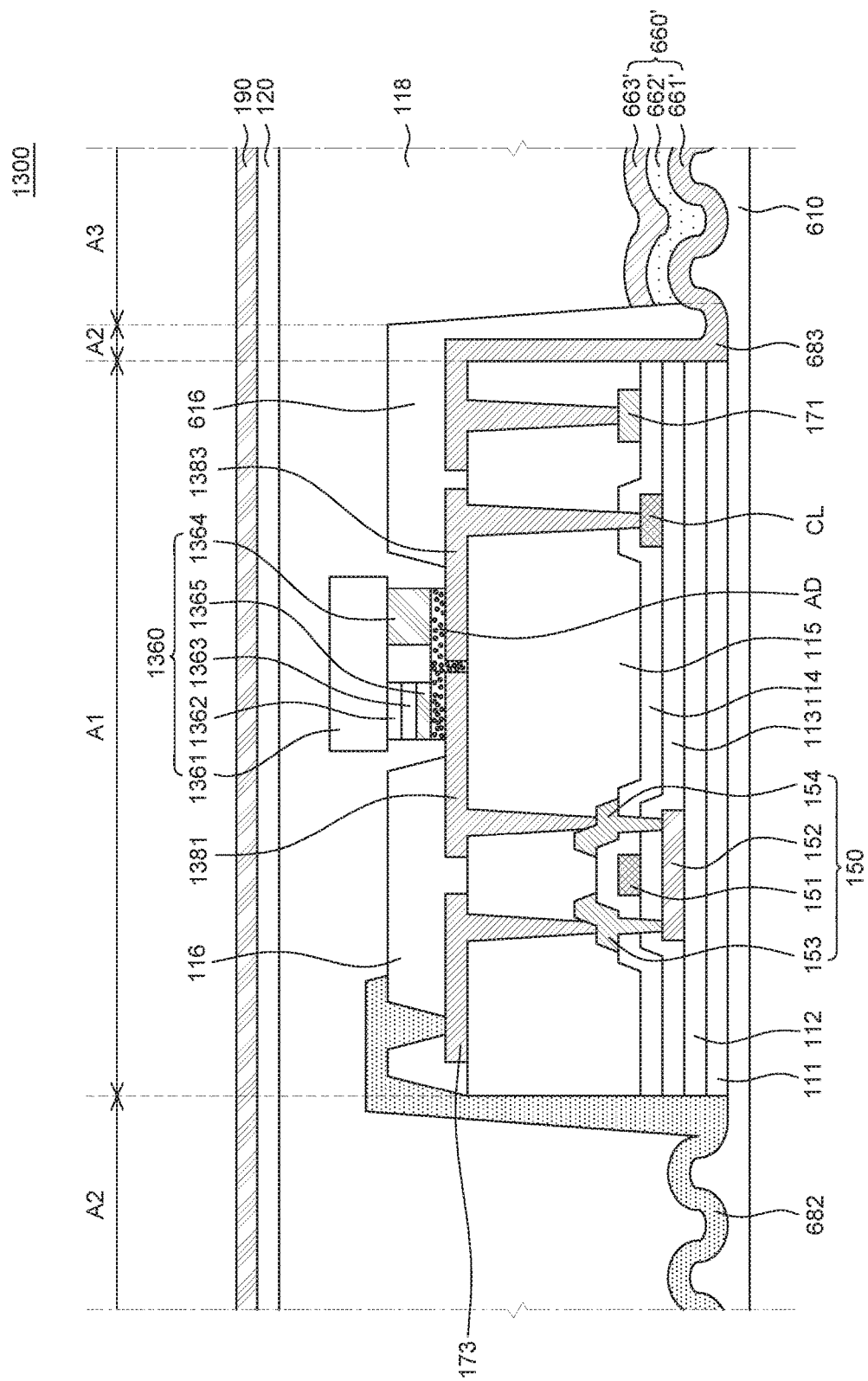
FIG. 13A is a cross-sectional view schematically showing a subpixel of a stretchable display device according to another embodiment of the present disclosure.
Figure 13B:
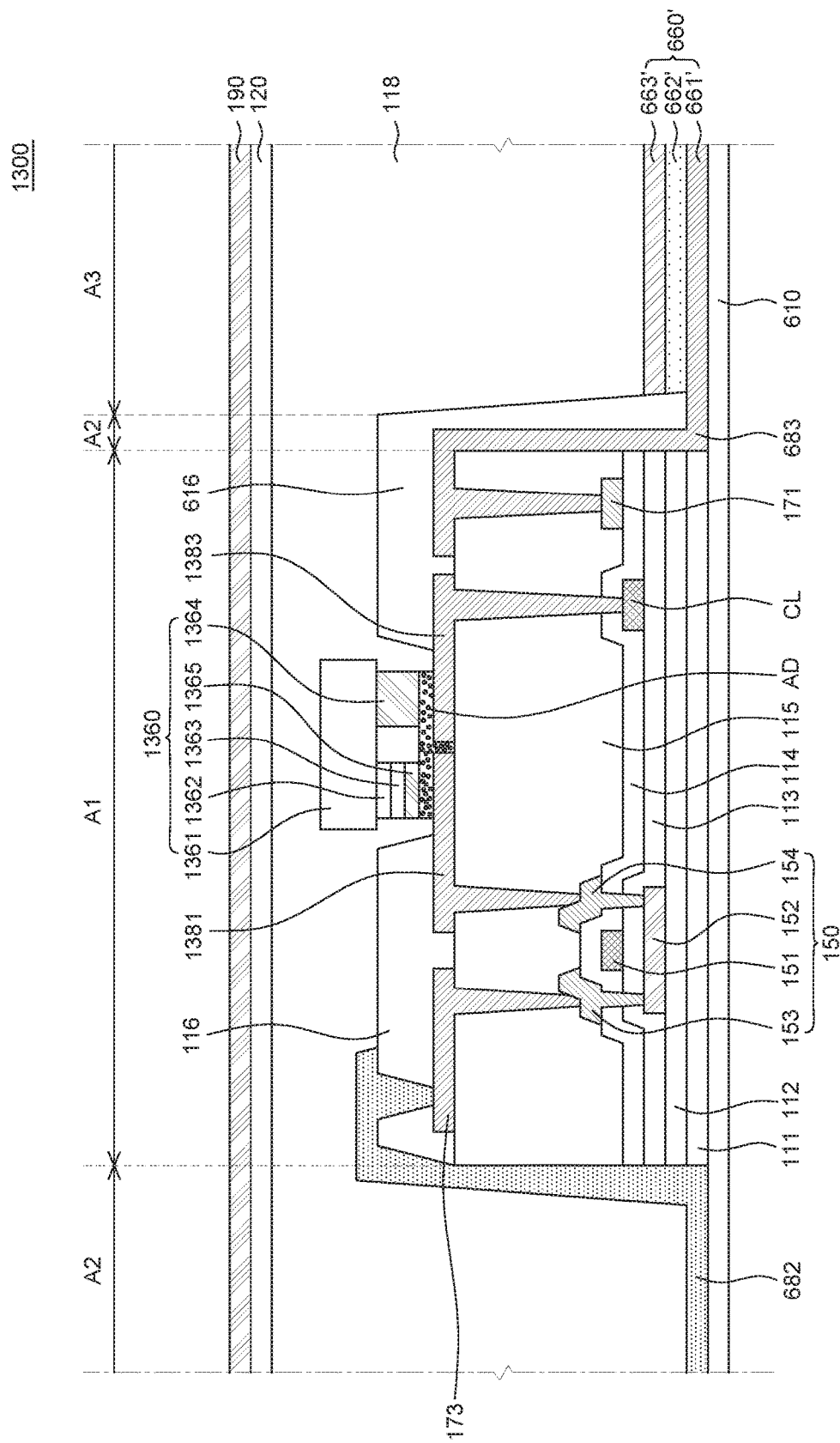
FIG. 13B is a schematic cross-sectional view about the case when the stretchable display device of FIG. 13A has been stretched.

FIG. 13A is a cross-sectional view schematically showing a subpixel of a stretchable display device according to another embodiment of the present disclosure. FIG. 13B is a schematic cross-sectional view about the case when the stretchable display device of FIG. 13A has been stretched. The stretchable display device 1300 shown in FIGS. 13A and 13B is the same in substantial configuration as the stretchable display device 700 of FIGS. 7A and 7B except for the difference in that the light emitting element is an LED 1360, so repeated description is omitted.

Referring to FIG. 13A, a common line CL is disposed on a gate insulating layer 113. The common line CL is a line applying a common voltage to a plurality of subpixels SPX. The common line CL may be made of the same material as the gate electrode 151 of the transistor 150 but is not limited thereto.

A first connecting pad 1381 and a second connecting pad 1383 are disposed on a planarization layer 115.

The first connecting pad 1381 electrically connects the transistor 150 and the LED 1360. The first connecting pad 1381 is connected with the drain electrode 154 of the transistor 150 through a contact hole formed at the planarization layer 115. However, the first connecting pad 1381 is not limited thereto and may be connected with the source electrode 153 of the transistor 150, depending on the type of the transistor 150. Accordingly, a p-electrode 1365 of the LED 1360 and the drain electrode 154 of the transistor 150 may be electrically connected by the first connecting pad 1381.

The second connecting pad 1383 electrically connects the LED 1360 and the common line CL. In detail, the second connecting pad 1383 is connected with the common line CL through a contact hole formed at the planarization layer 115 and the inter-layer insulating layer 114. Accordingly, the common line CL and an n-electrode 1364 of the LED 1360 are electrically connected by the second connecting pad 1383.

The LED 1360 is disposed on the first connecting pad 1381 and the second connecting pad 1383. The LED 1360 includes an n-type layer 1361, an active layer 1362, a p-type layer 1363, an n-electrode 1364, and a p-electrode 1365. The LED 1360 of the display device 1300 according to another embodiment of the present disclosure has a flip-chip structure in which the n-electrode 1364 and the p-electrode 1365 are formed on one surface.

The n-type layer 1361 may be formed by injecting an n-type impurity into a gallium nitride (GaN) having excellent crystallinity. The n-type layer 1361 may be disposed on a separate base substrate made of a material that can emit light.

The active layer 1362 is disposed on the n-type layer 1361. The active layer 1362, which is a light emitting layer that emits light in the LED 1360, may be made of a nitride semiconductor, for example, an indium gallium nitride (InGaN). The p-type layer 1363 is disposed on the active layer 1362. The p-type layer 1363 may be formed by injecting a p-type impurity into a gallium nitride (GaN).

The LED 1360 according to an embodiment of the present disclosure is, as described above, manufactured in a way of sequentially stacking the n-type layer 1361, the active layer 1362, and the p-type layer 1363, etching a predetermined portion, and then forming the n-electrode 1364 and the p-electrode 1365. In this process, the predetermined portion is a space for spacing the n-electrode 1364 and the p-electrode 1365 and the predetermined portion is etched to expose a portion of the n-type layer 1361. In other words, the surface of the LED 1360 where the n-electrode 1364 and the p-electrode 1365 will be disposed is not a planarized surface and may have different height levels.

The n-electrode 1364 is disposed on the etched area, in other words, the n-type layer 1361 exposed by the etching process, as described above. The n-electrode 1364 may be made of a conductive material. Meanwhile, the p-electrode 1365 is disposed on the non-etched area, in other words, the p-type layer 1363. The p-electrode 1365 may also be made of a conductive material, and for example, may be made of the same material as the n-electrode 1364.

An adhesive layer AD is disposed on the top surfaces of the first connecting pad 1381 and the second connecting pad 1383 and between the first connecting pad 1381 and the second connecting pad 1383, so the LED 1360 can be bonded to the first connecting pad 1381 and the second connecting pad 1383. In this configuration, the n-electrode 1364 may be disposed on the second connecting pad 1383 and the p-electrode 1365 may be disposed on the first connecting pad 1381.

The adhesive layer AD may be a conductive adhesive layer in which conductive balls are distributed in an insulating base member. Accordingly, when heat or pressure is applied to the adhesive layer AD, conductive balls are electrically connected at the portion to which the heat or pressure is applied, so the portion may have a conductive characteristic. Further, the non-pressurized area may have an insulating characteristic. For example, the n-electrode 1364 is electrically connected with the second connecting pad 1383 through the adhesive layer AD and the p-electrode 1365 is electrically connected with the first connecting pad 1381 through the adhesive layer AD. That is, it is possible to electrically connect the first connecting pad 1381 and the p-electrode 1365 and electrically connect the second connecting pad 1383 and the n-electrode 1364 in a way of applying the adhesive layer AD to the first connecting pad 1381 and the second connecting pad 1383 through a method such as ink-jet, transferring the LED 1360 on the adhesive layer AD, and then pressurizing and heating the LED 1360. However, the other portion of the adhesive layer AD except for the portion of the adhesive layer AD disposed between the n-electrode 1364 and the second connecting pad 1383 and the portion of the adhesive layer AD disposed between the p-electrode 1365 and the first connecting pad 1381 has an insulating characteristic. Meanwhile, the adhesive layer AD may be disposed in a separate type on each of the first connecting pad 1381 and the second connecting pad 1383.

As described above, since the stretchable display device 1300 according to another embodiment of the present disclosure has a structure in which the LED 1360 is disposed on the lower substrate 110 on which the transistor 150 is disposed, when the stretchable display device 1300 is turned on, the voltage levels that are different from each other and respectively applied to the first connecting pad 1381 and the second connecting pad 1383 are respectively transmitted to the n-electrode 1364 and the p-electrode 1365, whereby the LED 1360 emits light.

On the other hand, referring to FIG. 13B, when the stretchable display device 1300 is stretched, the connecting lines 682 and 683 can be stretched together with the lower substrate 610. For example, as the lower substrate 610 is stretched, the second connecting line 682 and the third connecting line 683 that were formed in an uneven shape in the second area A2 and the third area A3 can become a straight shape while stretching.

Further, referring to FIG. 13B, when the stretchable display device 600 is stretched, the additional organic light emitting element 660' can be stretched together with the lower substrate 610. In detail, the additional anode 661', the additional organic light emitting layer 662' and the additional cathode 663' of the additional organic light emitting element 660' that had a curved shape can become a straight shape while stretching.

As described above, the light emitting element may be the LED 1360 in the stretchable display device 1300 according to another embodiment of the present disclosure. Since the LED 1360 is made of not an organic material, but an inorganic material, reliability is high, so the lifespan is longer than that of a liquid crystal display element or an organic light emitting element. Further, the LED 1360 is quickly turned on, consumes a small amount of power, has high stability because it has high shock-resistance, and can display high-luminance images because it has high emission efficiency. Accordingly, the LED 1360 is an element that is suitable to be applied even to very large screens. In particular, since the LED 1360 is made of not an organic material, but an inorganic material, an encapsulation layer that is required when an organic light emitting element is used may not be used. Accordingly, the encapsulation layer that may be easily damaged, such as cracking, when the stretchable display device is stretched may be omitted. Accordingly, it is possible to omit use of an encapsulation layer that may be damaged when the stretchable display device according to another embodiment of the present disclosure is deformed such as bending or stretching, by using the LED 1360 as a light emitting element in the stretchable display device. Further, since the LED 1360 is made of not an organic material, but an inorganic material, the light emitting elements of the stretchable display device according to another embodiment of the present disclosure can be protected from water or oxygen and their reliability may be excellent.

LED Disposed on Additional Subpixel

As described above, it is exemplified that an organic light emitting element is disposed on an additional subpixel in the stretchable display device according to another embodiment of the present disclosure. However, the light emitting element disposed on an additional subpixel in a stretchable display device 1400 may be made of an LED. Next, the case when the light emitting element disposed on an additional subpixel is an LED in a stretchable display device 1400 according to another embodiment of the present disclosure is described.

Figure 14A:
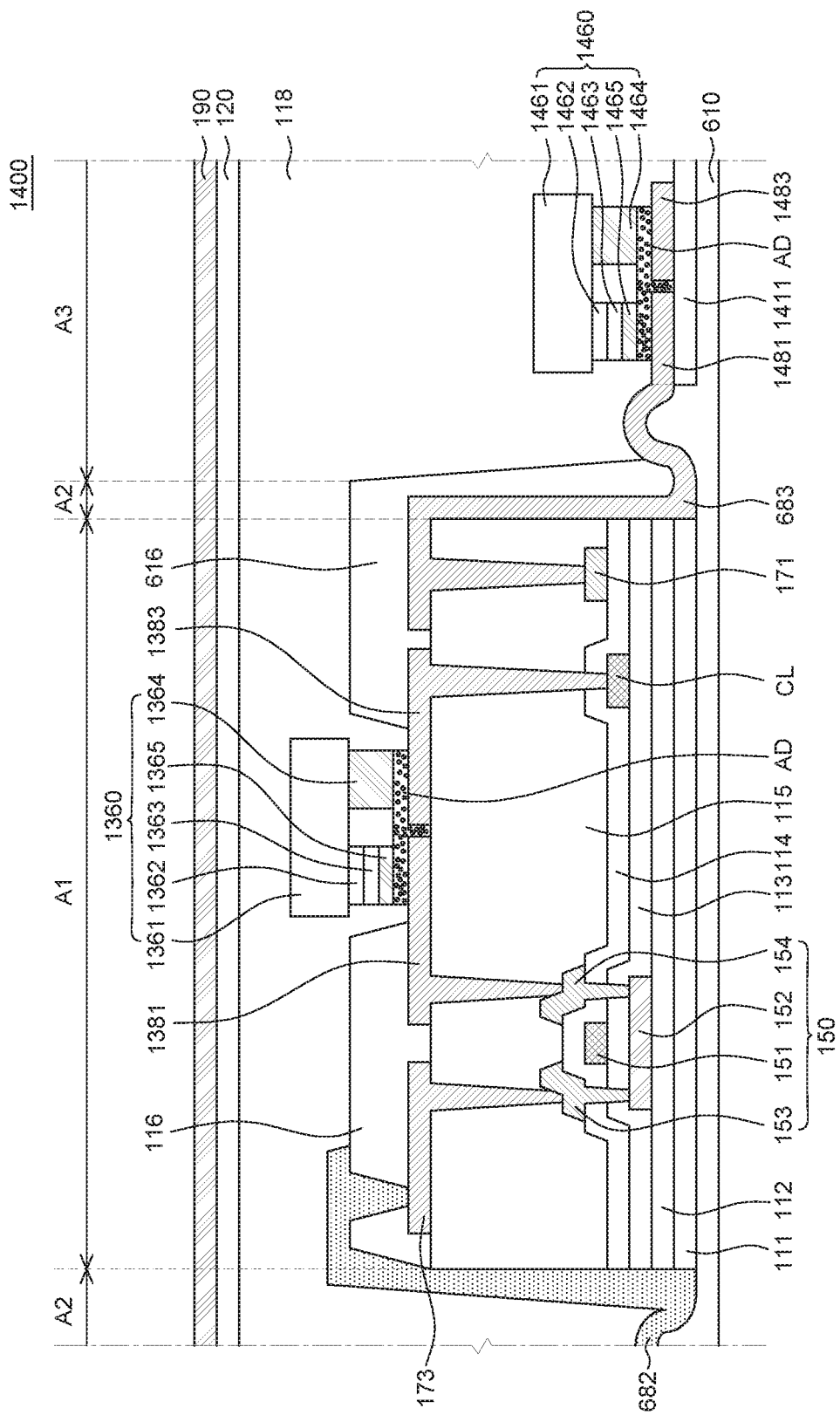
FIG. 14A is a cross-sectional view schematically showing a subpixel of a stretchable display device according to another embodiment of the present disclosure.
Figure 14B:
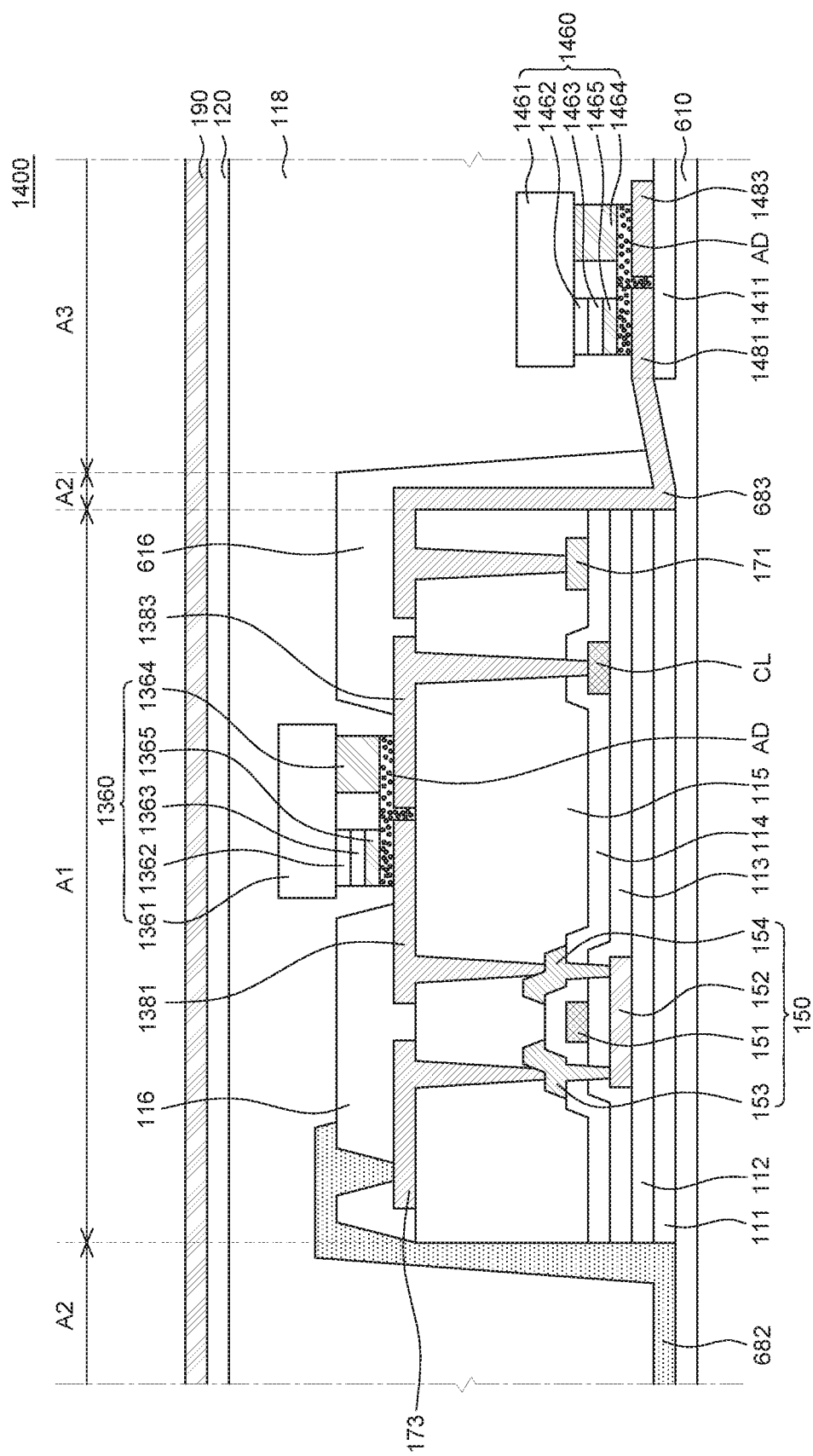
FIG. 14B is a schematic cross-sectional view about the case when the stretchable display device of FIG. 14A has been stretched.

FIG. 14A is a cross-sectional view schematically showing a subpixel of a stretchable display device according to another embodiment of the present disclosure. FIG. 14B is a schematic cross-sectional view about the case when the stretchable display device of FIG. 14A has been stretched. The stretchable display device 1400 shown in FIGS. 14A and 14B is the same in substantial configuration as the stretchable display device 1300 of FIGS. 13A and 13B except for the difference in that the light emitting element disposed in an additional subpixel is an LED 1460, so repeated description is omitted.

Referring to FIG. 14A, an additional individual substrate 1411 may be disposed on the lower substrate 610 in a third area A3. That is, the additional individual substrate 1411 is disposed and spaced apart from the individual substrate 111, which is disposed in the first area A1, on the same layer on the lower substrate 610. Further, the top surface and the bottom surface of the additional individual substrate 1411 may be flat and the top surface of a portion of the lower substrate 610 that is in contact with the additional individual substrate 1411 may also be flat.

Further, the additional individual substrate 1411 is a component for disposing an additional LED 1460 and the additional individual substrate 1411 may be rigid in comparison to the lower substrate 610. That is, the lower substrate 610 may be softer than the additional individual substrate 1411 and the additional individual substrate 1411 may be more rigid than the lower substrate 610.

The additional individual substrate 1411, which is a rigid substrate, may be made of a plastic material having flexibility and, for example, may be made of polyimide (PI), polyacrylate, polyacetate, etc.

The modulus of the additional individual substrate 1411 may be higher than that of the lower substrate 610. The modulus is an elastic modulus showing the ratio of deformation of a substrate deformed by stress to stress applied to the substrate, and when the modulus is relatively high, the hardness may be relatively high. Accordingly, the additional individual substrate 1411 may be a plurality of rigid substrates that is more rigid than the lower substrate 610. The modulus of the additional individual substrate 1411 may be a thousand times or more larger than that of the lower substrate 610, but is not limited thereto.

A third connecting pad 1481 and a fourth connecting pad 1483 are disposed on the additional individual substrate 1411.

The third connecting pad 1481 electrically connects the third connecting line 683 and the additional LED 1460. In detail, a p-electrode 1465 of the additional LED 1460 and the third connecting line 683 are electrically connected by the third connecting pad 1481.

The fourth connecting pad 1483 electrically connects the additional LED 1460 and the common line CL. Though not shown in detail in FIG. 14A, the fourth connecting pad 1483 is electrically connected with the common line CL, and in the third area A3, the fourth connecting pad 1483 is connected with the additional LED 1460 through the adhesive layer AD. Accordingly, the common line CL and an n-electrode 1464 of the LED 1460 are electrically connected by the fourth connecting pad 1483.

The additional LED 1460 is disposed on the third connecting pad 1481 and the fourth connecting pad 1483. The additional LED 1460 includes an n-type layer 1461, an active layer 1462, a p-type layer 1463, an n-electrode 1464, and a p-electrode 1465. The additional LED 1460 of the display device 1400 according to another embodiment of the present disclosure has a flip-chip structure in which the n-electrode 1464 and the p-electrode 1465 are formed on one surface.

The n-type layer 1461 may be formed by injecting an n-type impurity into a gallium nitride (GaN) having excellent crystallinity. The n-type layer 1461 may be disposed on a separate base substrate made of a material that can emit light.

The active layer 1462 is disposed on the n-type layer 1461. The active layer 1462, which is a light emitting layer that emits light in the additional LED 1460, may be made of a nitride semiconductor, for example, an indium gallium nitride (InGaN). The p-type layer 1463 is disposed on the active layer 1462. The p-type layer 1463 may be formed by injecting a p-type impurity into a gallium nitride (GaN).

The additional LED 1460 according to an embodiment of the present disclosure is, as described above, manufactured in a way of sequentially stacking the n-type layer 1461, the active layer 1462, and the p-type layer 1463, etching a predetermined portion, and then forming the n-electrode 1464 and the p-electrode 1465. In this process, the predetermined portion is a space for spacing the n-electrode 1464 and the p-electrode 1465 and the predetermined portion is etched to expose a portion of the n-type layer 1461. In other words, the surface of the additional LED 1460 where the n-electrode 1464 and the p-electrode 1465 will be disposed is not a planarized surface and may have different height levels.

The n-electrode 1464 is disposed on the etched area, in other words, the n-type layer 1461 exposed by the etching process, as described above. The n-electrode 1464 may be made of a conductive material. Meanwhile, the p-electrode 1465 is disposed on the non-etched area, in other words, the p-type layer 1463. The p-electrode 1465 may also be made of a conductive material, and for example, may be made of the same material as the n-electrode 1464.

The adhesive layer AD is disposed on the top surfaces of the third connecting pad 1481 and the fourth connecting pad 1483 and between the third connecting pad 1481 and the fourth connecting pad 1483, so the additional LED 1460 can be bonded to the third connecting pad 1481 and the fourth connecting pad 1483. In this configuration, the n-electrode 1464 may be disposed on the fourth connecting pad 1483 and the p-electrode 1465 may be disposed on the third connecting pad 1481.

The adhesive layer AD may be a conductive adhesive layer in which conductive balls are distributed in an insulating base member. Accordingly, when heat or pressure is applied to the adhesive layer AD, conductive balls are electrically connected at the portion to which the heat or pressure is applied, so the portion may have a conductive characteristic. Further, the non-pressurized area may have an insulating characteristic. For example, the n-electrode 1464 is electrically connected with the fourth connecting pad 1483 through the adhesive layer AD and the p-electrode 1465 is electrically connected with the third connecting pad 1481 through the adhesive layer AD. That is, it is possible to electrically connect the third connecting pad 1481 and the p-electrode 1465 and electrically connect the fourth connecting pad 1483 and the n-electrode 1464 in a way of applying the adhesive layer AD to the third connecting pad 1481 and the fourth connecting pad 1483 through a method such as ink-jet, transferring the additional LED 1460 on the adhesive layer AD, and then pressurizing and heating the additional LED 1460. However, the other portion of the adhesive layer AD except for the portion of the adhesive layer AD disposed between the n-electrode 1464 and the fourth connecting pad 1483 and the portion of the adhesive layer AD disposed between the p-electrode 1465 and the third connecting pad 1481 has an insulating characteristic. Meanwhile, the adhesive layer AD may be disposed in a separate type on each of the third connecting pad 1481 and the fourth connecting pad 1483.

As described above, since the stretchable display device 1400 according to another embodiment of the present disclosure has a structure in which the additional LED 1460 is disposed in the third area A3 in which the additional subpixel is disposed, when the stretchable display device 1400 is turned on, the voltage levels that are different from each other and respectively applied to the third connecting pad 1481 and the fourth connecting pad 1483 are respectively transmitted to the n-electrode 1464 and the p-electrode 1465, whereby the additional LED 1460 emits light.

On the other hand, referring to FIG. 14B, when the stretchable display device 1400 is stretched, connecting lines 682 and 683 can be stretched together with the lower substrate 610. For example, as the lower substrate 610 is stretched, the second connecting line 682 and the third connecting line 683 that were formed in an uneven shape in the second area A2 and the third area A3 can become a straight shape while stretching.

However, even though the stretchable display device 1400 is stretched, the additional individual substrate 1411 that is a rigid substrate is not stretched, so the additional LED 1460 itself disposed on the additional individual substrate 1411 is not stretched. Accordingly, external force due to stretching is not applied to the additional LED 1460, so the additional LED 1460 is not damaged by stretching of the stretchable display device 1400.

As described above, the additional LED 1460 may be disposed on the additional subpixel in the stretchable display device 1400 according to another embodiment of the present disclosure. Since the additional LED 1460 is made of not an organic material, but an inorganic material, reliability is excellent, so the lifespan is longer than that of a liquid crystal display element or an organic light emitting element. The additional LED 1460 is quickly turned on, consumes a small amount of power, has high stability because it has high shock-resistance, and can display high-luminance images because it has high emission efficiency. Accordingly, the additional LED 1460 is an element that is suitable to be applied even to very large screens. In particular, since the additional LED 1460 is made of not an organic material, but an inorganic material, an encapsulation layer that is required when an organic light emitting element is used may not be used. Accordingly, the encapsulation layer that may be easily damaged, such as cracking, when the stretchable display device is stretched may be omitted. Accordingly, it is possible to omit use of an encapsulation layer that may be damaged when the stretchable display device according to another embodiment of the present disclosure is deformed such as bending or stretching, by using the additional LED 1460 as a light emitting element in the stretchable display device. Further, since the additional LED 1460 is made of not an organic material, but an inorganic material, the light emitting elements of the stretchable display device according to another embodiment of the present disclosure can be protected from water or oxygen and their reliability may be excellent.

Figure 15:
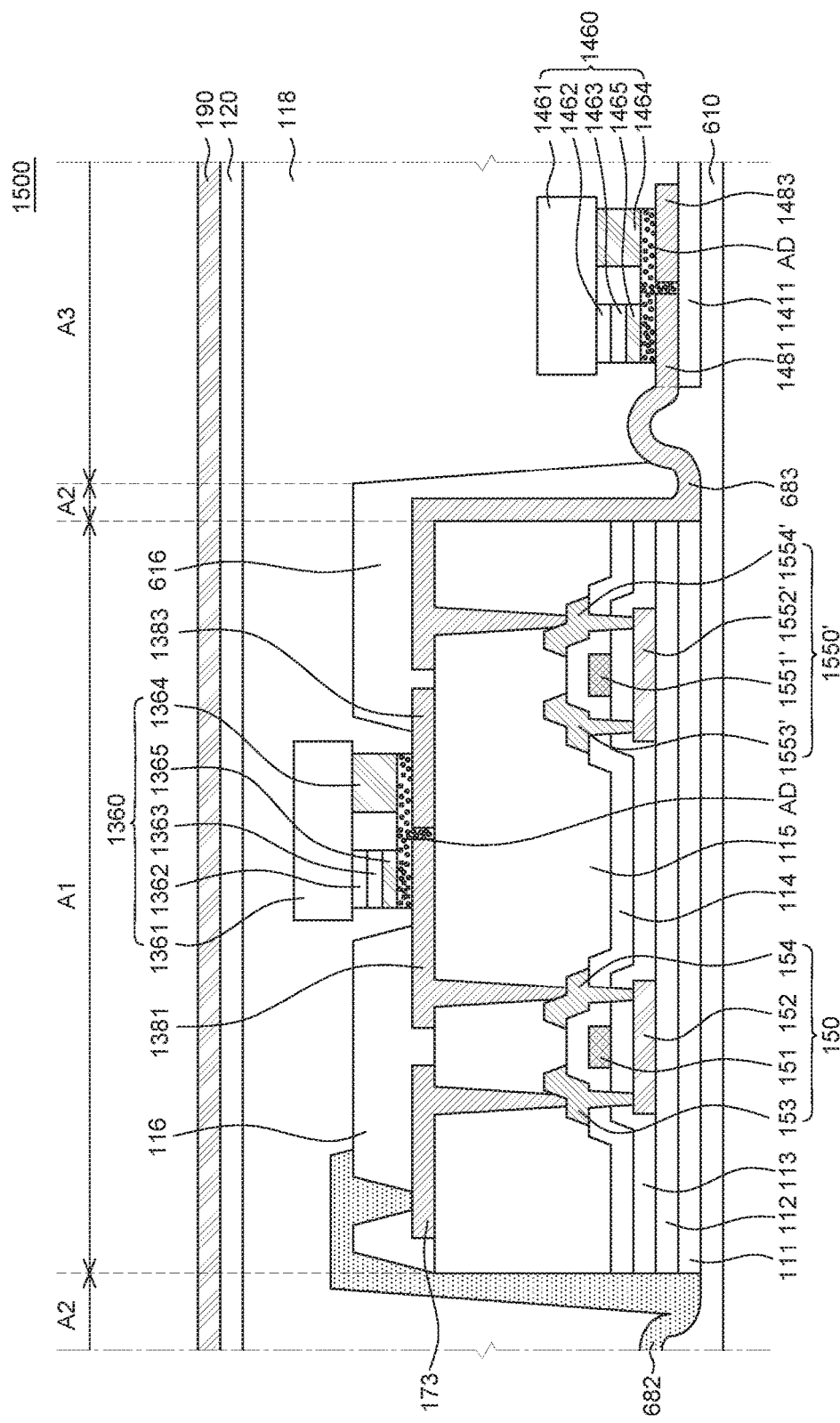
FIG. 15 is a cross-sectional view schematically showing a subpixel of a stretchable display device according to another embodiment of the present disclosure.

FIG. 15 is a cross-sectional view schematically showing a subpixel of a stretchable display device according to another embodiment of the present disclosure. A stretchable display device 1500 shown in FIG. 15 is substantially the same as the stretchable display device 1400 shown in FIGS. 14A and 14B except that a second transistor 1550' is added, so repeated description is omitted.

Referring to FIG. 15, a second transistor 1550' including a second gate electrode 1551', a second active layer 1552', a second source electrode 1553', and a second drain electrode 1554' is formed on the buffer layer 112. For example, the second active layer 1552' is formed on the buffer layer 112, and a gate insulating layer 113 for insulating the second active layer 1552' and the second gate electrode 1551' is formed on the second active layer 1552'. An inter-layer insulating layer 114 for insulating the second gate electrode 1551', the second source electrode 1553', and the second drain electrode 1554' is formed, and the second source electrode 1553' and the second drain electrode 1554' that are each in contact with the second active layer 1552' are formed on the inter-layer insulating layer 114.

Further, a planarization layer 115 is formed on the first transistor 150, the second transistor 1550', and the inter-layer insulating layer 114. The planarization layer 115 planarizes the upper portions of the first transistor 150 and the second transistor 1550'. The planarization layer 115 may have a contact hole for electrically connecting the first transistor 150 and the first connecting pad 1381, a contact hole for electrically connecting the data pad 173 and the first source electrode 153, and a contact hole for connecting the second drain electrode 1554' and the third connecting line 683.

In some embodiments, a passivation layer may be formed between the first transistor 150 and the second transistor 1550', and the planarization layer 115. That is, a passivation layer covering the first transistor 150 and the second transistor 1550' may be formed to protect the first transistor 150 and the second transistor 1550' from permeation of water, oxygen, etc. The passivation layer may be made of an inorganic material and may be composed of a single layer or a multi-layer but is not limited thereto.

Referring to FIG. 15, an additional LED 1460 connected with the second transistor 1550' through a third connecting line 683 is disposed in the third area A3 of a lower substrate 610. The additional LED 1460 disposed on the additional individual substrate 1411 and the LEDs 160 disposed on a plurality of individual substrates 111 are respectively connected with different transistors, so they can be independently driven.

Additional subpixels ASPX1, ASPX2, and ASPX3 of the stretchable display device 1500 according to another embodiment of the present disclosure are connected to a different circuit from subpixels SPX1, SPX2, and SPX3 disposed on the plurality of individual substrates 111. Accordingly, in the stretchable display device 1500 according to another embodiment of the present disclosure, the additional subpixels ASPX1, ASPX2, and ASPX3 and the subpixels SPX1, SPX2, and SPX3 are independently driven, so resolution can be increased.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A stretchable display device, comprising:
    a lower substrate made of a stretchable insulating material and having an active area and a non-active area adjacent to the active area;
    a plurality of individual substrates spaced apart from each other and disposed in the active area of the lower substrate;
    a buffer layer disposed on the plurality of individual substrates;
    a gate insulating layer disposed on the buffer layer;
    an inter-layer insulating layer disposed on the gate insulating layer;
    a planarization layer disposed on the inter-layer insulating layer;
    pixels disposed on the plurality of individual substrates respectively; and
    a plurality of connecting lines disposed between the plurality of individual substrates on the lower substrate, and electrically connecting corresponding pads disposed within the plurality of individual substrates respectively,
    wherein the modulus of elasticity of the plurality of individual substrates is higher than the modulus of elasticity of the lower substrate, and
    wherein the buffer layer, the gate insulating layer, the inter-layer insulating layer and the planarization layer are formed by patterning to correspond to the plurality of individual substrates respectively.

2. The stretchable display device of claim 1, wherein each of the plurality of connecting lines includes a base polymer made of a stretchable insulating material and conductive particles disposed within the base polymer.

3. The stretchable display device of claim 2, wherein both the base polymer and the conductive particles are formed in a straight-line shape.

4. The stretchable display device of claim 2, wherein the base polymer is formed as a single layer covering areas of the lower substrate which are not overlapped with the plurality of individual substrates, and the conductive particles are formed in a straight-line shape within the base polymer.

5. The stretchable display device of claim 2, wherein the top surface of each of the plurality of connecting lines is flat.

6. The stretchable display device of claim 1, wherein each of the plurality of connecting lines is made of the same material as the pads and formed as a curved shape on the lower substrate.

7. The stretchable display device of claim 6, wherein the plurality of connecting lines comprise a plurality of first connecting lines extending in a first direction and a plurality of second connecting lines extending in a second direction different from the first direction, and
    wherein the plurality of first connecting lines are made of a same material as gate electrodes of driving transistors included in the pixels, and the plurality of second connecting lines are made of a same material as source electrodes or drain electrodes of the driving transistors.

8. The stretchable display device of claim 6, wherein a conductive reinforcing member is disposed under or over a predetermined area of the connecting lines.

9. The stretchable display device of claim 8, wherein conductive reinforcing member is made of a conductive polymer including a base polymer and conductive particles, or a liquid metal.

10. The stretchable display device of claim 8, wherein the conductive reinforcing member is disposed in a peak area of the connecting lines and the peak area of the connecting lines being indicative of an area where an amplitude of the connecting lines is the largest.

11. The stretchable display device of claim 10, wherein the peak area is an area where a stress of the stretching is concentrated.

12. The stretchable display device of claim 1, wherein the active area of the lower substrate is divided into a plurality of first areas in which the plurality of individual substrates are disposed, a plurality of second areas in which the connecting lines are disposed, and a plurality of third areas surrounded by the plurality of first areas and the plurality of second areas.

13. The stretchable display device of claim 12, wherein top surfaces of the third areas of the lower substrate have an uneven shape, and top surfaces of the first areas of the lower substrate have a flat shape.

14. The stretchable display device of claim 13, further comprising:
a plurality of additional pixels formed in the plurality of third areas of the lower substrate respectively.

15. The stretchable display device of claim 14, further comprising:
additional light emitting elements disposed in the plurality of additional pixels.

16. The stretchable display device of claim 15, wherein each of the additional light emitting elements comprises an anode, an organic light emitting layer, and a cathode, and
wherein the anode, the organic light emitting layer and the cathode have a shape corresponding to the uneven shape respectively.

17. The stretchable display device of claim 15, wherein the additional light emitting elements are LEDs.

18. The stretchable display device of claim 14, wherein driving transistors included in the pixels formed in the first areas are shared with the additional pixels formed in the third areas.

19. The stretchable display device of claim 14, wherein a plurality of additional driving transistors included in the additional pixels are disposed on the plurality of individual substrates and drive the plurality of additional pixels respectively.

20. The stretchable display device of claim 14, further comprising:
an encapsulation layer disposed to both cover the pixels on the plurality of individual substrates and the additional pixels formed on the third areas.

21. The stretchable display device of claim 20, wherein the encapsulation layer is not formed to cover the second areas of the lower substrate.

22. The stretchable display device of claim 13, wherein top surfaces of the second areas of the lower substrate have an uneven shape.

23. The stretchable display device of claim 22, wherein the connecting lines have a shape corresponding to the uneven shape.

24. The stretchable display device of claim 1, further comprising:
an upper substrate made of a stretchable insulating material and overlapped with the lower substrate; and
a polarizing layer disposed on the upper substrate and configured to suppress external light reflection.

25. The stretchable display device of claim 1, further comprising:
a plurality of light emitting elements disposed in a plurality of subpixels; and
a plurality of additional light emitting elements disposed in a plurality of additional subpixels,
wherein the same voltage is applied to an anode of a first light emitting element of the plurality of light emitting elements and an anode of a first additional light emitting element of the plurality of additional light emitting elements.

26. The stretchable display device of claim 25, wherein the anode of the first light emitting element and the anode of the first additional light emitting element are integrated.

27. The stretchable display device of claim 25, further comprising a transistor disposed on an individual substrate, on which the first light emitting element is disposed, of the plurality of individual substrates, and applying the same voltage to the anode of the first light emitting element and the anode of the first additional light emitting element.

28. The stretchable display device of claim 1, further comprising a plurality of light emitting elements disposed on a plurality of subpixels; and
a plurality of additional light emitting elements disposed on a plurality of additional subpixels,
wherein the plurality of light emitting elements and the plurality of additional light emitting elements are configured to be independently driven from each other.

29. The stretchable display device of claim 28, further comprising:
a first transistor connected to an anode of a first light emitting element of the plurality of light emitting elements, and disposed on an individual substrate, in which the first light emitting element is disposed, of the plurality of individual substrates; and
a second transistor connected to an anode of a first additional light emitting element of the plurality of additional light emitting elements, and disposed on the same individual substrate as the first transistor.

* * * * *